(12) United States Patent
Fujii et al.

(10) Patent No.: US 10,717,886 B2
(45) Date of Patent: Jul. 21, 2020

(54) INK COMPOSITION, METHOD FOR PRODUCING ORGANIC SEMICONDUCTOR ELEMENT, ORGANIC SEMICONDUCTOR DEVICE, AND METHOD FOR PRODUCING OPTICAL ELEMENT

(71) Applicant: SEIKO EPSON CORPORATION, Tokyo (JP)

(72) Inventors: Tatsuya Fujii, Suwa (JP); Takuya Sonoyama, Fujimi-machi (JP); Shotaro Watanabe, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 150 days.

(21) Appl. No.: 15/654,064

(22) Filed: Jul. 19, 2017

(65) Prior Publication Data

US 2018/0030296 A1 Feb. 1, 2018

(30) Foreign Application Priority Data

Jul. 26, 2016 (JP) .................. 2016-146022

(51) Int. Cl.

| C09D 11/36 | (2014.01) |
|---|---|
| C09D 11/52 | (2014.01) |
| C09D 11/106 | (2014.01) |
| H01L 51/00 | (2006.01) |
| C09D 11/102 | (2014.01) |
| C09D 11/033 | (2014.01) |
| C09D 11/328 | (2014.01) |
| C09D 11/54 | (2014.01) |
| H01L 51/50 | (2006.01) |

(52) U.S. Cl.
CPC ............ *C09D 11/36* (2013.01); *C09D 11/033* (2013.01); *C09D 11/102* (2013.01); *C09D 11/106* (2013.01); *C09D 11/328* (2013.01); *C09D 11/52* (2013.01); *C09D 11/54* (2013.01); *H01L 51/004* (2013.01); *H01L 51/0005* (2013.01); *H01L 51/0007* (2013.01); *H01L 51/0037* (2013.01); *H01L 51/5012* (2013.01); *H01L 51/5088* (2013.01)

(58) Field of Classification Search
CPC .................................................... C09D 11/36
See application file for complete search history.

(56) References Cited

U.S. PATENT DOCUMENTS

| 8,178,597 B2 | 5/2012 | Sasada et al. |
| 2002/0052501 A1* | 5/2002 | Taniguchi ............ C07D 491/16 546/66 |

(Continued)

FOREIGN PATENT DOCUMENTS

| JP | H11-116863 A | 4/1999 |
| JP | 2005-103392 A | 4/2005 |

(Continued)

*Primary Examiner* — Robert A Vetere
(74) *Attorney, Agent, or Firm* — Oliff PLC

(57) ABSTRACT

An ink composition includes a first component which is a hydrophilic solvent, a second component which is a hydrophobic solvent, a third component which is an amphiphilic solvent, and a fourth component which includes a solute or a dispersing element, and when the third component evaporates, the ink composition is separated into a phase which mainly includes the first component and a phase which mainly includes the second component.

6 Claims, 19 Drawing Sheets

(56) References Cited

U.S. PATENT DOCUMENTS

| | | |
|---|---|---|
| 2009/0203823 A1 | 8/2009 | Sasada et al. |
| 2011/0114075 A1* | 5/2011 | Mills .................... C01B 3/00 126/263.01 |
| 2015/0064828 A1* | 3/2015 | Watanabe .............. C09K 11/06 438/46 |

FOREIGN PATENT DOCUMENTS

| | | |
|---|---|---|
| JP | 2009-191134 A | 8/2009 |
| JP | 2011-049028 A | 3/2011 |
| JP | 4687110 B2 | 5/2011 |
| JP | 2014-173079 A | 9/2014 |

* cited by examiner

| FIRST COMPONENT (HYDROPHILIC SOLVENT) | | | SECOND COMPONENT (HYDROPHOBIC SOLVENT) | | | THIRD COMPONENT (AMPHIPHILIC SOLVENT) | PHASE SEPARATION PROPERTY |
|---|---|---|---|---|---|---|---|
| NAME OF COMPOUND | SPECIFIC GRAVITY [g/cm³] | NORMAL BOILING POINT [°C] | NAME OF COMPOUND | SPECIFIC GRAVITY [g/cm³] | NORMAL BOILING POINT [°C] | NAME OF COMPOUND SPECIES | |
| ETHYLENE GLYCOL | 1.11 | 197 | HEXYLBENZENE | 0.86 | 226 | 1-ALKYL ALCOHOL | A |
| | | | | | | 2-ALKANONE | B |
| | | | DODECYLBENZENE | 0.86 | 264 | 1-ALKYL ALCOHOL | A |
| | | | | | | 2-ALKANONE | B |
| | | | DECYLBENZENE | 0.86 | 298 | 1-ALKYL ALCOHOL | A |
| | | | | | | 2-ALKANONE | A |
| | | | OCTYLBENZENE | 0.86 | 331 | 1-ALKYL ALCOHOL | A |
| | | | | | | 2-ALKANONE | A |
| | | | 1,3-DIISOPROPYLBENZENE | 0.98 | 333 | 1-ALKYL ALCOHOL | A |
| | | | | | | 2-ALKANONE | A |
| | | | 1,1-BIS (3,4-DIMETHYLPHENYL) ETHANE | 0.86 | 203 | 1-ALKYL ALCOHOL | B |
| | | | | | | 2-ALKANONE | B |
| DIETHYLENE GLYCOL | 1.12 | 244 | HEXYLBENZENE | 0.86 | 226 | 1-ALKYL ALCOHOL | A |
| | | | | | | 2-ALKANONE | B |
| | | | DODECYLBENZENE | 0.86 | 264 | 1-ALKYL ALCOHOL | A |
| | | | | | | 2-ALKANONE | A |
| | | | DECYLBENZENE | 0.86 | 298 | 1-ALKYL ALCOHOL | A |
| | | | | | | 2-ALKANONE | A |
| | | | OCTYLBENZENE | 0.86 | 331 | 1-ALKYL ALCOHOL | A |
| | | | | | | 2-ALKANONE | A |
| | | | 1,3-DIISOPROPYLBENZENE | 0.98 | 333 | 1-ALKYL ALCOHOL | A |
| | | | | | | 2-ALKANONE | A |
| | | | 1,1-BIS (3,4-DIMETHYLPHENYL) ETHANE | 0.86 | 203 | 1-ALKYL ALCOHOL | A |
| | | | | | | 2-ALKANONE | B |
| TRIETHYLENE GLYCOL | 1.12 | 285 | HEXYLBENZENE | 0.86 | 226 | 1-ALKYL ALCOHOL | A |
| | | | | | | 2-ALKANONE | A |
| | | | DODECYLBENZENE | 0.86 | 264 | 1-ALKYL ALCOHOL | A |
| | | | | | | 2-ALKANONE | A |
| | | | DECYLBENZENE | 0.86 | 298 | 1-ALKYL ALCOHOL | A |
| | | | | | | 2-ALKANONE | A |
| | | | OCTYLBENZENE | 0.86 | 331 | 1-ALKYL ALCOHOL | A |
| | | | | | | 2-ALKANONE | A |
| | | | 1,3-DIISOPROPYLBENZENE | 0.98 | 333 | 1-ALKYL ALCOHOL | A |
| | | | | | | 2-ALKANONE | A |
| | | | 1,1-BIS (3,4-DIMETHYLPHENYL) ETHANE | 0.86 | 203 | 1-ALKYL ALCOHOL | A |
| | | | | | | 2-ALKANONE | B |
| PROPYLENE GLYCOL | 1.04 | 188 | HEXYLBENZENE | 0.86 | 226 | 1-ALKYL ALCOHOL | A |
| | | | | | | 2-ALKANONE | B |
| | | | DODECYLBENZENE | 0.86 | 264 | 1-ALKYL ALCOHOL | A |
| | | | | | | 2-ALKANONE | B |
| | | | DECYLBENZENE | 0.86 | 298 | 1-ALKYL ALCOHOL | A |
| | | | | | | 2-ALKANONE | A |
| | | | OCTYLBENZENE | 0.86 | 331 | 1-ALKYL ALCOHOL | A |
| | | | | | | 2-ALKANONE | A |
| | | | 1,3-DIISOPROPYLBENZENE | 0.98 | 333 | 1-ALKYL ALCOHOL | B |
| | | | | | | 2-ALKANONE | B |
| | | | 1,1-BIS (3,4-DIMETHYLPHENYL) ETHANE | 0.86 | 203 | 1-ALKYL ALCOHOL | A |
| | | | | | | 2-ALKANONE | B |

FIG. 9

| FIRST COMPONENT (HYDROPHILIC SOLVENT) | | | SECOND COMPONENT (HYDROPHOBIC SOLVENT) | | | THIRD COMPONENT (AMPHIPHILIC SOLVENT) | PHASE SEPARATION PROPERTY |
|---|---|---|---|---|---|---|---|
| NAME OF COMPOUND | SPECIFIC GRAVITY [g/cm³] | NORMAL BOILING POINT [°C] | NAME OF COMPOUND | SPECIFIC GRAVITY [g/cm³] | NORMAL BOILING POINT [°C] | NAME OF COMPOUND SPECIES | |
| DIETHYLENE GLYCOL MONOMETHYL ETHER | 1.02 | 194 | HEXYLBENZENE | 0.86 | 226 | 1-ALKYL ALCOHOL | A |
| | | | | | | 2-ALKANONE | B |
| | | | DODECYLBENZENE | 0.86 | 264 | 1-ALKYL ALCOHOL | A |
| | | | | | | 2-ALKANONE | B |
| | | | DECYLBENZENE | 0.86 | 298 | 1-ALKYL ALCOHOL | A |
| | | | | | | 2-ALKANONE | A |
| | | | OCTYLBENZENE | 0.86 | 331 | 1-ALKYL ALCOHOL | A |
| | | | | | | 2-ALKANONE | A |
| | | | 1,3-DIISOPROPYLBENZENE | 0.98 | 333 | 1-ALKYL ALCOHOL | A |
| | | | | | | 2-ALKANONE | A |
| | | | 1,1-BIS(3,4-DIMETHYLPHENYL)ETHANE | 0.86 | 203 | 1-ALKYL ALCOHOL | A |
| | | | | | | 2-ALKANONE | B |
| DIETHYLENE GLYCOL MONOETHYL ETHER | 0.99 | 202 | HEXYLBENZENE | 0.86 | 226 | 1-ALKYL ALCOHOL | A |
| | | | | | | 2-ALKANONE | B |
| | | | DODECYLBENZENE | 0.86 | 264 | 1-ALKYL ALCOHOL | A |
| | | | | | | 2-ALKANONE | B |
| | | | DECYLBENZENE | 0.86 | 298 | 1-ALKYL ALCOHOL | A |
| | | | | | | 2-ALKANONE | A |
| | | | OCTYLBENZENE | 0.86 | 331 | 1-ALKYL ALCOHOL | A |
| | | | | | | 2-ALKANONE | A |
| | | | 1,3-DIISOPROPYLBENZENE | 0.98 | 333 | 1-ALKYL ALCOHOL | A |
| | | | | | | 2-ALKANONE | A |
| | | | 1,1-BIS(3,4-DIMETHYLPHENYL)ETHANE | 0.86 | 203 | 1-ALKYL ALCOHOL | A |
| | | | | | | 2-ALKANONE | B |
| DIETHYLENE GLYCOL MONOPROPYL ETHER | 0.97 | 214 | HEXYLBENZENE | 0.86 | 226 | 1-ALKYL ALCOHOL | A |
| | | | | | | 2-ALKANONE | B |
| | | | DODECYLBENZENE | 0.86 | 264 | 1-ALKYL ALCOHOL | A |
| | | | | | | 2-ALKANONE | A |
| | | | DECYLBENZENE | 0.86 | 298 | 1-ALKYL ALCOHOL | A |
| | | | | | | 2-ALKANONE | A |
| | | | OCTYLBENZENE | 0.86 | 331 | 1-ALKYL ALCOHOL | A |
| | | | | | | 2-ALKANONE | A |
| | | | 1,3-DIISOPROPYLBENZENE | 0.98 | 333 | 1-ALKYL ALCOHOL | A |
| | | | | | | 2-ALKANONE | B |
| | | | 1,1-BIS(3,4-DIMETHYLPHENYL)ETHANE | 0.86 | 203 | 1-ALKYL ALCOHOL | A |
| | | | | | | 2-ALKANONE | B |
| DIETHYLENE GLYCOL MONOBUTYL ETHER | 0.95 | 230 | HEXYLBENZENE | 0.86 | 226 | 1-ALKYL ALCOHOL | A |
| | | | | | | 2-ALKANONE | B |
| | | | DODECYLBENZENE | 0.86 | 264 | 1-ALKYL ALCOHOL | A |
| | | | | | | 2-ALKANONE | B |
| | | | DECYLBENZENE | 0.86 | 298 | 1-ALKYL ALCOHOL | A |
| | | | | | | 2-ALKANONE | A |
| | | | OCTYLBENZENE | 0.86 | 331 | 1-ALKYL ALCOHOL | A |
| | | | | | | 2-ALKANONE | A |
| | | | 1,3-DIISOPROPYLBENZENE | 0.98 | 333 | 1-ALKYL ALCOHOL | A |
| | | | | | | 2-ALKANONE | B |
| | | | 1,1-BIS(3,4-DIMETHYLPHENYL)ETHANE | 0.86 | 203 | 1-ALKYL ALCOHOL | A |
| | | | | | | 2-ALKANONE | B |

FIG.10

| FIRST COMPONENT (HYDROPHILIC SOLVENT) | | | SECOND COMPONENT (HYDROPHOBIC SOLVENT) | | | THIRD COMPONENT (AMPHIPHILIC SOLVENT) | PHASE SEPARATION PROPERTY |
|---|---|---|---|---|---|---|---|
| NAME OF COMPOUND | SPECIFIC GRAVITY [g/cm³] | NORMAL BOILING POINT [°C] | NAME OF COMPOUND | SPECIFIC GRAVITY [g/cm³] | NORMAL BOILING POINT [°C] | NAME OF COMPOUND SPECIES | |
| DIETHYLENE GLYCOL MONOHEXYL ETHER | 0.93 | 259 | HEXYLBENZENE | 0.86 | 226 | 1-ALKYL ALCOHOL | B |
| | | | | | | 2-ALKANONE | B |
| | | | DODECYLBENZENE | 0.86 | 264 | 1-ALKYL ALCOHOL | B |
| | | | | | | 2-ALKANONE | B |
| | | | DECYLBENZENE | 0.86 | 298 | 1-ALKYL ALCOHOL | A |
| | | | | | | 2-ALKANONE | B |
| | | | OCTYLBENZENE | 0.86 | 331 | 1-ALKYL ALCOHOL | A |
| | | | | | | 2-ALKANONE | A |
| | | | 1,3-DIISOPROPYLBENZENE | 0.98 | 333 | 1-ALKYL ALCOHOL | A |
| | | | | | | 2-ALKANONE | A |
| | | | 1,1-BIS(3,4-DIMETHYLPHENYL)ETHANE | 0.86 | 203 | 1-ALKYL ALCOHOL | A |
| | | | | | | 2-ALKANONE | A |
| DIETHYLENE GLYCOL MONOISOBUTYL ETHER | 0.95 | 220 | HEXYLBENZENE | 0.86 | 226 | 1-ALKYL ALCOHOL | A |
| | | | | | | 2-ALKANONE | B |
| | | | DODECYLBENZENE | 0.86 | 264 | 1-ALKYL ALCOHOL | A |
| | | | | | | 2-ALKANONE | B |
| | | | DECYLBENZENE | 0.86 | 298 | 1-ALKYL ALCOHOL | A |
| | | | | | | 2-ALKANONE | A |
| | | | OCTYLBENZENE | 0.86 | 331 | 1-ALKYL ALCOHOL | A |
| | | | | | | 2-ALKANONE | A |
| | | | 1,3-DIISOPROPYLBENZENE | 0.98 | 333 | 1-ALKYL ALCOHOL | A |
| | | | | | | 2-ALKANONE | A |
| | | | 1,1-BIS(3,4-DIMETHYLPHENYL)ETHANE | 0.86 | 203 | 1-ALKYL ALCOHOL | B |
| | | | | | | 2-ALKANONE | B |
| TRIETHYLENE GLYCOL MONOMETHYL ETHER | 1.05 | 249 | HEXYLBENZENE | 0.86 | 226 | 1-ALKYL ALCOHOL | A |
| | | | | | | 2-ALKANONE | A |
| | | | DODECYLBENZENE | 0.86 | 264 | 1-ALKYL ALCOHOL | A |
| | | | | | | 2-ALKANONE | A |
| | | | DECYLBENZENE | 0.86 | 298 | 1-ALKYL ALCOHOL | A |
| | | | | | | 2-ALKANONE | A |
| | | | OCTYLBENZENE | 0.86 | 331 | 1-ALKYL ALCOHOL | A |
| | | | | | | 2-ALKANONE | A |
| | | | 1,3-DIISOPROPYLBENZENE | 0.98 | 333 | 1-ALKYL ALCOHOL | A |
| | | | | | | 2-ALKANONE | A |
| | | | 1,1-BIS(3,4-DIMETHYLPHENYL)ETHANE | 0.86 | 203 | 1-ALKYL ALCOHOL | A |
| | | | | | | 2-ALKANONE | A |
| TRIETHYLENE GLYCOL MONOBUTYL ETHER | 0.99 | 271 | HEXYLBENZENE | 0.86 | 226 | 1-ALKYL ALCOHOL | A |
| | | | | | | 2-ALKANONE | A |
| | | | DODECYLBENZENE | 0.86 | 264 | 1-ALKYL ALCOHOL | A |
| | | | | | | 2-ALKANONE | A |
| | | | DECYLBENZENE | 0.86 | 298 | 1-ALKYL ALCOHOL | A |
| | | | | | | 2-ALKANONE | A |
| | | | OCTYLBENZENE | 0.86 | 331 | 1-ALKYL ALCOHOL | A |
| | | | | | | 2-ALKANONE | A |
| | | | 1,3-DIISOPROPYLBENZENE | 0.98 | 333 | 1-ALKYL ALCOHOL | A |
| | | | | | | 2-ALKANONE | A |
| | | | 1,1-BIS(3,4-DIMETHYLPHENYL)ETHANE | 0.86 | 203 | 1-ALKYL ALCOHOL | A |
| | | | | | | 2-ALKANONE | A |

FIG.11

| | UNIFORMITY OF FILM THICKNESS |
|---|---|
| EXAMPLE 1 | S |
| EXAMPLE 2 | A |
| COMPARATIVE EXAMPLE 1 | B |
| COMPARATIVE EXAMPLE 3 | B |

|  | DRIVING VOLTAGE | CURRENT EFFICIENCY | HALF LIFETIME |
|---|---|---|---|
| EXAMPLE 1 | 0.8 | 1.2 | 1.4 |
| EXAMPLE 2 | 1.0 | 1.3 | 1.7 |
| COMPARATIVE EXAMPLE 2 | 1.0 | 1.0 | 1.0 |
| COMPARATIVE EXAMPLE 4 | 1.1 | 1.1 | 1.2 |

| SECOND COMPONENT (HYDROPHOBIC SOLVENT) | | | FIRST COMPONENT (HYDROPHILIC SOLVENT) | | | THIRD COMPONENT (AMPHIPHILIC SOLVENT) | PHASE SEPARATION PROPERTY |
|---|---|---|---|---|---|---|---|
| NAME OF COMPOUND | SPECIFIC GRAVITY [g/cm³] | NORMAL BOILING POINT [°C] | NAME OF COMPOUND | SPECIFIC GRAVITY [g/cm³] | NORMAL BOILING POINT [°C] | NAME OF COMPOUND SPECIES | |
| 2-METHYL-BENZOFURAN | 1.06 | 197 | 1,7-HEPTANEDIOL | 0.96 | 262 | 1-ALKYL ALCOHOL | A |
| | | | | | | 2-ALKANONE | B |
| | | | 1,5-PENTANEDIOL | 0.99 | 239 | 1-ALKYL ALCOHOL | A |
| | | | | | | 2-ALKANONE | B |
| | | | 1,2-HEXANEDIOL | 0.95 | 224 | 1-ALKYL ALCOHOL | A |
| | | | | | | 2-ALKANONE | B |
| | | | 2,5-HEXANEDIOL | 0.96 | 217 | 1-ALKYL ALCOHOL | A |
| | | | | | | 2-ALKANONE | B |
| 3-PHENOXY-TOLUENE | 1.05 | 272 | 1,7-HEPTANEDIOL | 0.96 | 262 | 1-ALKYL ALCOHOL | A |
| | | | | | | 2-ALKANONE | A |
| | | | 1,5-PENTANEDIOL | 0.99 | 239 | 1-ALKYL ALCOHOL | A |
| | | | | | | 2-ALKANONE | A |
| | | | 1,2-HEXANEDIOL | 0.95 | 224 | 1-ALKYL ALCOHOL | A |
| | | | | | | 2-ALKANONE | A |
| | | | 2,5-HEXANEDIOL | 0.96 | 217 | 1-ALKYL ALCOHOL | A |
| | | | | | | 2-ALKANONE | A |
| 2,3-DIHYDRO-BENZOFURAN | 1.03 | 198 | 1,7-HEPTANEDIOL | 0.96 | 262 | 1-ALKYL ALCOHOL | A |
| | | | | | | 2-ALKANONE | B |
| | | | 1,5-PENTANEDIOL | 0.99 | 239 | 1-ALKYL ALCOHOL | A |
| | | | | | | 2-ALKANONE | A |
| | | | 1,2-HEXANEDIOL | 0.95 | 224 | 1-ALKYL ALCOHOL | A |
| | | | | | | 2-ALKANONE | A |
| | | | 2,5-HEXANEDIOL | 0.96 | 217 | 1-ALKYL ALCOHOL | B |
| | | | | | | 2-ALKANONE | A |
| 3-METHYL-BENZOFURAN | 1.05 | 196 | 1,7-HEPTANEDIOL | 0.96 | 262 | 1-ALKYL ALCOHOL | B |
| | | | | | | 2-ALKANONE | B |
| | | | 1,5-PENTANEDIOL | 0.99 | 239 | 1-ALKYL ALCOHOL | B |
| | | | | | | 2-ALKANONE | B |
| | | | 1,2-HEXANEDIOL | 0.95 | 224 | 1-ALKYL ALCOHOL | B |
| | | | | | | 2-ALKANONE | B |
| | | | 2,5-HEXANEDIOL | 0.96 | 217 | 1-ALKYL ALCOHOL | B |
| | | | | | | 2-ALKANONE | B |
| 2,3-BENZOFURAN | 1.07 | 175 | 1,7-HEPTANEDIOL | 0.96 | 262 | 1-ALKYL ALCOHOL | B |
| | | | | | | 2-ALKANONE | B |
| | | | 1,5-PENTANEDIOL | 0.99 | 239 | 1-ALKYL ALCOHOL | B |
| | | | | | | 2-ALKANONE | A |
| | | | 1,2-HEXANEDIOL | 0.95 | 224 | 1-ALKYL ALCOHOL | B |
| | | | | | | 2-ALKANONE | A |
| | | | 2,5-HEXANEDIOL | 0.96 | 217 | 1-ALKYL ALCOHOL | B |
| | | | | | | 2-ALKANONE | A |

FIG.16

| | UNIFORMITY OF FILM THICKNESS | DRIVING VOLTAGE | CURRENT EFFICIENCY | HALF LIFETIME |
|---|---|---|---|---|
| EXAMPLE 3 | S | 0.6 | 1.4 | 1.9 |
| COMPARATIVE EXAMPLE 5 | C | — | — | — |
| COMPARATIVE EXAMPLE 6 | — | 1.0 | 1.0 | 1.2 |

INK COMPOSITION, METHOD FOR PRODUCING ORGANIC SEMICONDUCTOR ELEMENT, ORGANIC SEMICONDUCTOR DEVICE, AND METHOD FOR PRODUCING OPTICAL ELEMENT

BACKGROUND

1. Technical Field

The present invention relates to an ink composition, a method for producing an organic semiconductor element, an organic semiconductor device, and a method for producing an optical element.

2. Related Art

Heretofore, it has been known that inks (ink compositions) having different physical properties are used when forming a functional layer such as an organic electroluminescence (EL) element by an inkjet method. For example, JP-A-2011-49028 (Patent Document 1) proposes a technique for improving the uniformity of the layer thickness of a light-emitting functional layer by mixing inks having different specific gravities and boiling points (normal boiling points) in an ink for forming the light-emitting functional layer of an organic EL element.

However, there was a problem that when inks having different physical properties are mixed like the inks described in Patent Document 1, the ink components are likely to be non-uniform during storage or the like. More specifically, there was a possibility that an ink obtained by mixing inks which hardly dissolve in each other may cause separation of the ink components over time. When the ink was separated and became non-uniform in the inside or the like of a storage container of the ink or a liquid droplet ejection device including an inkjet head, the ejection from the inkjet head sometimes became unstable or a variation in the composition of the ink droplet (liquid droplet) to be ejected sometimes occurred.

Further, there was also a problem that when a variation in the composition of the ink droplet occurs, it is difficult to ensure the uniformity of the layer thickness (film thickness) in a formed light-emitting functional layer. More specifically, a variation in the composition of the ink droplet causes a variation in the content of the solvent, the functional layer forming material, or the like. Due to this, the drying property of the ink droplet varied for each ink droplet, and a variation in the film thickness of the light-emitting functional layer occurred among portions of an organic EL element or among organic EL elements in some cases. Due to the occurrence of a variation in the film thickness, there was a fear that it becomes difficult to obtain desired properties in the light-emitting functional layer.

Further, there was also a problem that when the uniformity of the film thickness in the light-emitting functional layer is tried to be improved by allowing the ink droplet to dry slowly, a risk that the solvent remains inside the film after drying increases and due to the effect of the residual solvent, the properties of the light-emitting functional layer are easily inhibited. More specifically, when the evaporation speed of the solvent is decreased by adjusting the normal boiling point of the solvent to be used in the ink or adjusting the vapor pressure, the uniformity of the film thickness of the formed light-emitting functional layer is improved, however, the residual solvent in the light-emitting functional layer is likely to increase. Due to this, the properties of the organic EL element were affected by the residual solvent in some cases. For example, there was a possibility that the current efficiency (luminous efficiency), emission lifetime, or the like of the light-emitting functional layer is decreased.

SUMMARY

An advantage of some aspects of the invention is to solve at least a part of the problems described above and the invention can be implemented as the following forms or application examples.

Application Example

An ink composition according to this application example includes a first component which is a hydrophilic solvent, a second component which is a hydrophobic solvent, a third component which is an amphiphilic solvent, and a fourth component which includes a solute or a dispersing element, and changes from one phase to two phases when the third component evaporates.

According to this application example, the uniformity of the ink components during storage or the like can be ensured, and also the uniformity of the film thickness in a film formed using the ink composition (ink) can be improved. More specifically, by including the amphiphilic solvent (third component), the compatibility between the hydrophilic solvent (first component) and the hydrophobic solvent (second component) is improved. Therefore, even if a component with different hydrophilicity like the hydrophobic solvent (second component) is mixed, as compared with an ink composition in the related art, the occurrence of non-uniformity such as separation of the ink composition over time (during storage) is suppressed. Further, since both of the hydrophilic solvent (first component) and the hydrophobic solvent (second component) are used, the solubility of the solute with different hydrophilicity or the dispersibility of the dispersing element is ensured, and the uniformity of the fourth component with respect to these solvents is improved. According to this, in the inside or the like of the storage container or the liquid droplet ejection device, separation or the like of the ink components of the ink composition over time is suppressed, and the composition can be maintained. In addition, a variation in the composition of the ink composition is less likely to occur, and therefore, the drying property of the ink droplet (the liquid droplet of the ink composition) becomes stable. Due to this, in the case where the film to be formed is used for an organic semiconductor element or the like, a variation in the film thickness is suppressed, and desired properties can be ensured.

In addition, the drying property of the ink droplet is controlled by a phase change, and the uniformity of the film thickness in the formed film (the flatness of the film) can be further improved. More specifically, by the evaporation of the amphiphilic solvent (third component), the compatibility between the hydrophilic solvent (first component) and the hydrophobic solvent (second component) is decreased, and the ink droplet is separated into two phases. At this time, by adjusting the drying property of a phase on the side coming into contact with a gas phase, the drying property of the whole ink droplet can be controlled.

Further, as described above, in order to improve the uniformity of the film thickness by controlling the drying property through a phase change, a solvent having an excellent drying property can be used as the first component or the second component. According to this, in the case where the formed film is used as an organic semiconductor element or the like, the effect of the residual solvent is suppressed, and the properties of an organic semiconductor element can be improved.

In the ink composition according to the application example, it is preferred that the normal boiling point of the third component is lower than the normal boiling point of the first component and the normal boiling point of the second component.

According to this configuration, prior to the evaporation of the hydrophilic solvent (first component) and the hydrophobic solvent (second component), the evaporation of the amphiphilic solvent (third component) proceeds. Due to this, the ink droplet is more likely to change into two phases, and therefore, the drying property of the ink droplet can be easily controlled.

In the ink composition according to the application example, it is preferred that the specific gravity of the first component is larger than the specific gravity of the second component.

According to this configuration, when the amphiphilic solvent (third component) evaporates and the ink droplet changes into two phases, a phase including the hydrophobic solvent (second component) can be located on the side coming into contact with a gas phase. Due to this, it becomes possible to control the drying property of the ink droplet by the hydrophobic solvent (second component).

In the ink composition according to the application example, it is preferred that the normal boiling point of the first component is lower than the normal boiling point of the second component.

According to this configuration, the most of the hydrophobic solvent (second component) which has a high normal boiling point and is less likely to evaporate is included in a phase on the side coming into contact with a gas phase. Due to this, the evaporation of the hydrophilic solvent (first component) is delayed. As a result, the drying of the ink droplet proceeds more slowly than in the related art, and therefore, the uniformity of the film thickness in the film formed by the ink droplets can be improved.

In the ink composition according to the application example, it is preferred that the specific gravity of the first component is smaller than the specific gravity of the second component.

According to this configuration, when the amphiphilic solvent (third component) evaporates and the ink droplet changes into two phases, a phase including the hydrophilic solvent (first component) can be located on the side coming into contact with a gas phase. Due to this, it becomes possible to control the drying property of the ink droplet by the hydrophilic solvent (first component).

In the ink composition according to the application example, it is preferred that the normal boiling point of the first component is higher than the normal boiling point of the second component.

According to this configuration, the most of the hydrophilic solvent (first component) which has a high normal boiling point and is less likely to evaporate is included in a phase on the side coming into contact with a gas phase. Due to this, the evaporation of the hydrophobic solvent (second component) is delayed. As a result, the drying of the ink droplet proceeds more slowly than in the related art, and therefore, the uniformity of the film thickness in the film formed by the ink droplets can be improved.

In the ink composition according to the application example, it is preferred that the solubility of the third component in the first component or the second component is 0.1 mass % or more.

According to this configuration, by the amphiphilic solvent (third component), the compatibility between the hydrophilic solvent (first component) and the hydrophobic solvent (second component) can be further improved.

In the ink composition according to the application example, it is preferred that the first component includes at least one type selected from a glycol ether compound or an alkanediol compound, the second component includes at least one type selected from an aromatic hydrocarbon compound and a heterocyclic compound, and the third component includes at least one type selected from a monoalcohol compound having 4 or more carbon atoms and an alkanone compound having 4 or more carbon atoms.

According to this configuration, by the amphiphilic solvent (third component), the compatibility between the hydrophilic solvent (first component) and the hydrophobic solvent (second component) can be further improved. Due to this, the uniformity of the ink components during storage or the like can be further improved. In addition, the uniformity of the film thickness in the film formed using the ink composition can be further improved.

In the ink composition according to the application example, it is preferred that the first component is selected from diethylene glycol, dipropylene glycol, triethylene glycol, tetraethylene glycol, triethylene glycol monobutyl ether, diethylene glycol monomethyl ether, triethylene glycol monomethyl ether, diethylene glycol monoisopropyl ether, ethylene glycol monobutyl ether, diethylene glycol monobutyl ether, ethylene glycol monoisobutyl ether, diethylene glycol monoisobutyl ether, ethylene glycol monohexyl ether, diethylene glycol monohexyl ether, ethylene glycol mono-2-ethylhexyl ether, diethylene glycol mono-2-ethylhexyl ether, ethylene glycol monoallyl ether, dipropylene glycol monomethyl ether, dipropylene glycol monopropyl ether, propylene glycol monobutyl ether, dipropylene glycol monobutyl ether, 1,2-ethanediol, 1,2-propanediol, 1,3-butanediol, 1,4-butanediol, 2,3-butanediol, 1,5-pentanediol, 2-methyl-2,4-pentanediol, 1,6-hexanediol, and 2-ethyl-1,3-hexanediol, the second component is selected from hexylbenzene, heptylbenzene, octylbenzene, nonylbenzene, decylbenzene, undecylbenzene, dodecylbenzene, diisopropylbenzene, cyclohexylbenzene, diphenyl ether, 3-phenoxytoluene, bisdimethylphenylethane, 2,3-dihydrobenzofuran, 2,3-dihydro-2-methylbenzofuran, 2,3-dihydro-2-ethylbenzofuran, and 2-methylbenzofuran, and the third component is selected from 1-butanol, 1-pentanol, 1-hexanol, 1-heptanol, 1-octanol, 1-nonanol, 2-butanone, 2-hexanone, 2-heptanone, 2-octanone, 2-nonanone, 2-decanone, 2-undecanone, and 2-dodecanone.

According to this configuration, by the amphiphilic solvent (third component), the compatibility between the hydrophilic solvent (first component) and the hydrophobic solvent (second component) can be further improved. Due to this, the uniformity of the ink components during storage or the like can be further improved. In addition, the uniformity of the film thickness in the film formed using the ink composition can be further improved.

In the ink composition according to the application example, it is preferred that the content of the second component with respect to the total mass is 10 mass % or more and 90 mass % or less, the content of the third component with respect to the total mass is 0.1 mass % or more and 50 mass % or less, and the content of the fourth component with respect to the total mass is 5 mass % or less.

According to this configuration, the compatibility between the hydrophilic solvent (first component) and the hydrophobic solvent (second component) can be ensured. Further, the content of the amphiphilic solvent (third component) is kept low, and thus, the time until the ejected ink droplet changes into two phases can be reduced. In addition, by keeping the content of the fourth component as the solute or the dispersing element low, the ejection of the ink composition from the inkjet head can be performed stably.

Application Example

A method for producing an organic semiconductor element according to this application example includes forming a functional layer of an organic semiconductor element using an ink composition, wherein the ink composition includes a first component which is a hydrophilic solvent, a second component which is a hydrophobic solvent, a third component which is an amphiphilic solvent, and a fourth component which includes a solute or a dispersing element, and changes from one phase to two phases when the third component evaporates.

According to this application example, the uniformity of the ink composition for forming a functional layer of an organic semiconductor element can be ensured in the inside or the like of a storage container or a liquid droplet ejection device, and also the uniformity of the film thickness of the formed functional layer can be improved. In addition, a variation in the components of the ink composition is less likely to occur, and therefore, desired properties can be ensured in the functional layer. Further, the drying property of the ink droplet is controlled by a phase change, and therefore, the uniformity of the film thickness of the functional layer can be further improved.

In the method for producing an organic semiconductor element according to the application example, it is preferred that the fourth component includes a hole injection layer forming material as the solute or the dispersing element.

According to this configuration, a variation in the film thickness of the hole injection layer among portions of an organic semiconductor element or among organic semiconductor elements occurs less, and therefore, a hole injection layer which is uniform and flat is formed, and desired properties can be obtained.

Application Example

An organic semiconductor device according to this application example includes an organic semiconductor element produced using the method for producing an organic semiconductor element according to the above application example.

According to this application example, an organic semiconductor device, in which a variation in the film thickness among portions of an organic semiconductor element or among organic semiconductor elements occurs less, and desired properties are stably exhibited in the organic semiconductor element can be provided.

Application Example

A method for producing an optical element according to this application example includes forming an optical element using an ink composition, wherein the ink composition includes a first component which is a hydrophilic solvent, a second component which is a hydrophobic solvent, a third component which is an amphiphilic solvent, and a fourth component which includes a solute or a dispersing element, and changes from one phase to two phases when the third component evaporates.

According to this application example, the uniformity of the ink composition for forming a functional layer of an optical element can be ensured in the inside or the like of a storage container or a liquid droplet ejection device, and also the uniformity of the film thickness of the formed functional layer can be improved. In addition, a variation in the components of the ink composition is less likely to occur, and therefore, desired properties can be ensured in the functional layer. Further, the drying property of the ink droplet is controlled by a phase change, and therefore, the uniformity of the film thickness of the functional layer can be further improved.

In the method for producing an optical element according to the application example, it is preferred that the fourth component includes a coloring material and a resin component as the solute or the dispersing element.

According to this configuration, as the functional layer of an optical element, a color filter layer or the like in which the uniformity of the film thickness is improved can be formed. Further, by including the resin component, the fixing property of the color filter layer can be improved.

BRIEF DESCRIPTION OF THE DRAWINGS

The invention will be described with reference to the accompanying drawings, wherein like numbers reference like elements.

FIG. 9 is a chart showing a phase separation property according to Examples of the first embodiment.

FIG. 10 is a chart showing a phase separation property according to Examples of the first embodiment.

FIG. 11 is a chart showing a phase separation property according to Examples of the first embodiment.

FIG. 16 is a chart showing a phase separation property according to Examples of the second embodiment.

DESCRIPTION OF EXEMPLARY EMBODIMENTS

Hereinafter, embodiments of the invention will be described with reference to the accompanying drawings. Incidentally, in the following respective drawings, in order to make respective layers and respective members have a recognizable size, the respective layers and the respective members are shown at a reduced scale different from the actual one.

First Embodiment

Organic EL Device

Figure 1:
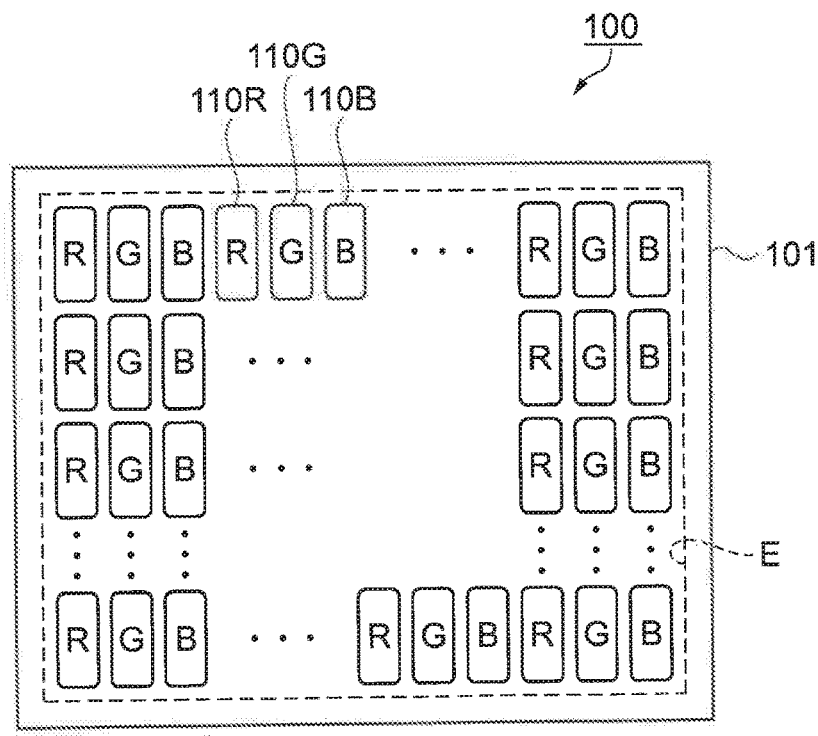
FIG. 1 is a schematic plan view showing a configuration of an organic EL device according to a first embodiment.

First, an organic EL device including an organic EL element related to an ink composition of this embodiment will be described with reference to FIG. 1. FIG. 1 is a schematic plan view showing a configuration of an organic EL device according to the first embodiment. In this embodiment, an organic semiconductor device including an organic semiconductor element will be described by showing an organic EL device including an organic EL element as an example. The organic EL device is applied to electronic apparatuses such as thin-screen televisions and portable information terminals, and other than these, also applied to lighting apparatuses and the like. Further, the ink composition will be described by showing an ink composition including a functional layer forming material for forming an organic semiconductor layer (functional layer) of the organic EL element by an inkjet method as an example.

An organic EL device 100 shown in FIG. 1 includes an element substrate 101 on which sub-pixels 110R, 110G, and 110B from which red (R), green (G), and blue (B) light emission (light emission color) is obtained are arranged. Each of the sub-pixels 110R, 110G, and 110B has a substantially rectangular shape, and is arranged in a matrix form in a display region E of the element substrate 101. The red (R), green (G), and blue (B) sub-pixels 110R, 110G, and 110B are also sometimes collectively referred to as "sub-pixel 110".

An organic EL element from which red (R) light emission is obtained is provided in the sub-pixel 110R. Similarly, an organic EL element from which green (G) light emission is obtained is provided in the sub-pixel 110G, and an organic EL element from which blue (B) light emission is obtained is provided in the sub-pixel 110B.

In such an organic EL device 100, the sub-pixels 110R, 110G, and 110B from which different light emission colors are obtained are taken as one display pixel unit, and the respective sub-pixels 110R, 110G, and 110B are electrically controlled. According to this, the organic EL device 100 can achieve full color display.

Organic EL Element

Figure 2:
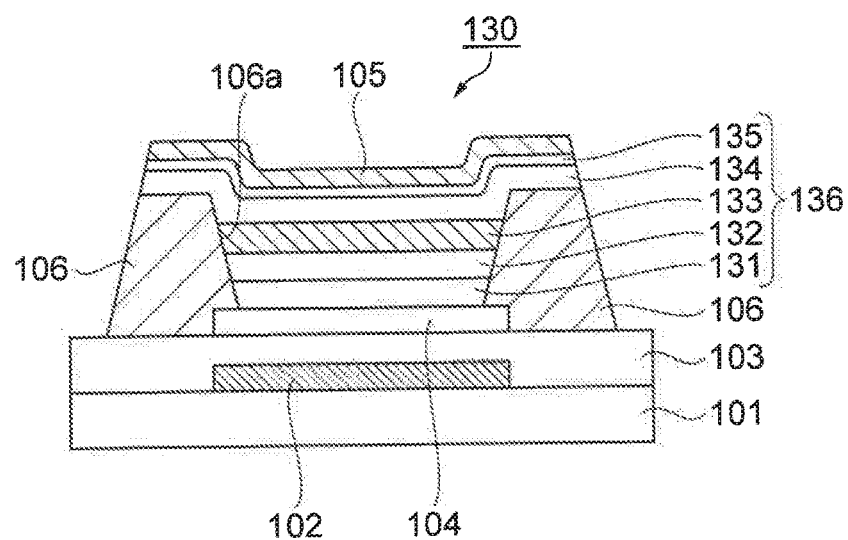
FIG. 2 is a schematic cross-sectional view showing a configuration of an organic EL element.

Next, the organic EL element as the organic semiconductor element according to this embodiment will be described with reference to FIG. 2. FIG. 2 is a schematic cross-sectional view showing a configuration of the organic EL device.

In each of the above-mentioned sub-pixels 110R, 110G, and 11B, an organic EL element 130 shown in FIG. 2 is provided. The organic EL element 130 includes a reflection layer 102 provided on the element substrate 101, an insulating film 103, a pixel electrode 104, a counter electrode 105, and a functional layer 136 which is provided between the pixel electrode 104 and the counter electrode 105 and includes a light-emitting layer 133.

The pixel electrode 104 functions as an anode, and is provided for each of the sub-pixels 110R, 110O, and 110B, and is formed using a transparent conductive film of, for example, indium tin oxide (ITO) or the like. According to this, the pixel electrode 104 has a light transmission property.

The reflection layer 102 is provided in the lower layer of the pixel electrode 104. The reflection layer 102 has a function to reflect light transmitted through the pixel electrode 104 and emitted from the functional layer 136 back to the pixel electrode 104 side. Therefore, the reflection layer 102 is formed using a metal having light reflectivity, for example, aluminum (Al), silver (Ag), or the like, or an alloy thereof, or the like. Further, in order to prevent an electrical short circuit between the reflection layer 102 and the pixel electrode 104, the insulating film 103 that covers the reflection layer 102 is provided. The insulating film 103 is formed using, for example, silicon oxide, silicon nitride, silicon oxynitride, or the like.

The functional layer 136 includes a hole injection layer (HIL) 131, a hole transport layer (HTL) 132, a light-emitting layer (or an emitting layer: EML) 133, an electron transport layer 134, and an electron injection layer 135 stacked in this order from the pixel electrode 104 side. In particular, the constituent material of the light-emitting layer 133 is selected according to the light emission color. The configuration of the functional layer 136 is not limited thereto, and an intermediate layer or the like which controls the movement of a carrier (a hole or an electron) may be included in addition to these layers.

The counter electrode 105 functions as a cathode, and is provided as a common electrode shared by the sub-pixels 110R, 110G, and 110B, and is formed using an alloy of aluminum (Al) or silver (Ag) and magnesium (Mg), or the like.

A hole is injected as a carrier from the anode (pixel electrode 104) side to the light-emitting layer 133, and an electron is injected as a carrier from the cathode (counter electrode 105) side to the light-emitting layer 133. An exciton (in a state where a hole and an electron are bound to each other by a Coulomb force) is formed by a hole and an electron injected in the light-emitting layer 133, and when the exciton disappears (when a hole and an electron are recombined with each other), part of energy is released as fluorescence or phosphorescence.

In the organic EL device 100, if the counter electrode 105 is configured to have a light transmission property, since the reflection layer 102 is included, it is possible to extract light emitted from the light-emitting layer 133 from the counter electrode 105 side. Such a light emission type is referred to as "top emission type". If the counter electrode 105 is configured to have light reflectivity without providing the reflection layer 102, it is possible to extract light emitted from the light-emitting layer 133 from the element substrate 101 side. Such a light emission type is referred to as "bottom emission type". In this embodiment, a configuration in which the light emission type of the organic EL device 100 (organic EL element 130) is a top emission type is adopted as an example. The organic EL device 100 of this embodiment includes a pixel circuit (not shown) capable of independently driving each organic EL element 130 for each of the sub-pixels 110R, 110G, and 110B on the element substrate 101. Such a driving type is called "active driving type". The pixel circuit can adopt a known configuration, and therefore, the illustration of the pixel circuit is omitted in FIG. 2.

The organic EL element 130 includes a partition wall 106 which forms an opening portion 106a on the pixel electrode 104. This partition wall 106 overlaps with the outer edge of the pixel electrode 104. Further, in the functional layer 136 of the organic EL element 130, at least one layer of the hole injection layer 131, the hole transport layer 132, and the light-emitting layer 133 included in the functional layer 136 is formed by a liquid phase process. The liquid phase process is a method for forming a layer by applying an ink composition including a component constituting the layer and a solvent to the opening portion 106a as a film forming region surrounded by the partition wall 106 and drying. In order to form a layer at a desired film thickness, it is necessary to accurately apply a predetermined amount of the ink composition to the opening portion 106a, and in this embodiment, an inkjet method (liquid droplet ejection method) is adopted as the liquid phase process. Hereinafter, the ink composition is sometimes simply referred to as "ink".

Here, in the organic EL device 100 of a top emission type, it is preferred that the cross-sectional shape of each layer included in the functional layer 136 is flat. The ink composition of this embodiment includes a functional layer forming material, and a predetermined amount of the ink composition is uniformly applied to the opening portion 106a and dried so as to make the cross-sectional shape of each layer flat. The detailed configuration of the ink composition will be described later.

Method for Producing Organic EL Element

Figure 3A:
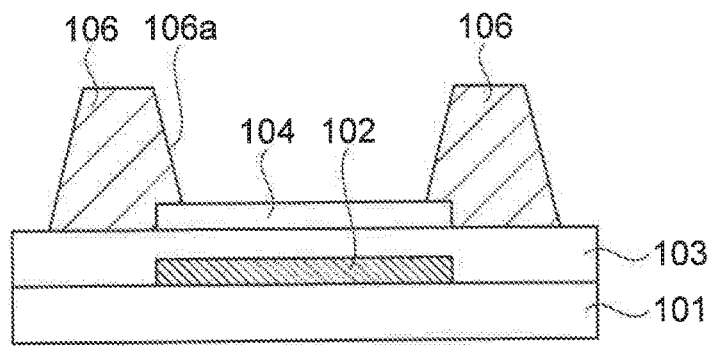
FIG. 3A is a schematic cross-sectional view showing a method for producing an organic EL element.
Figure 3B:
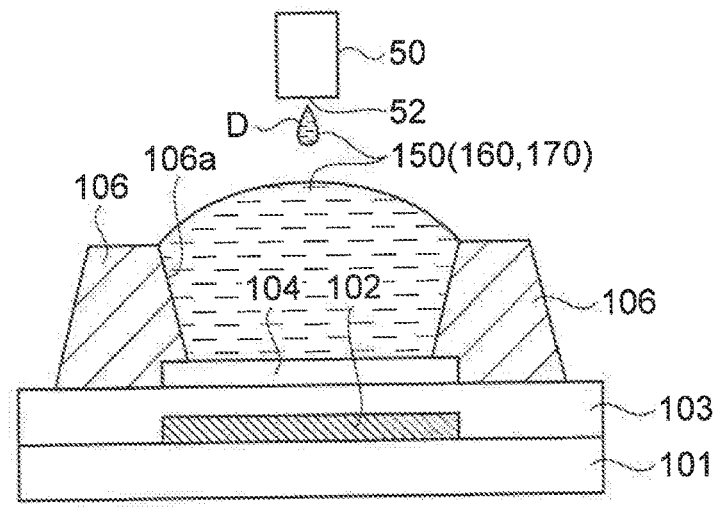
FIG. 3B is a schematic cross-sectional view showing a method for producing an organic EL element.
Figure 3C:
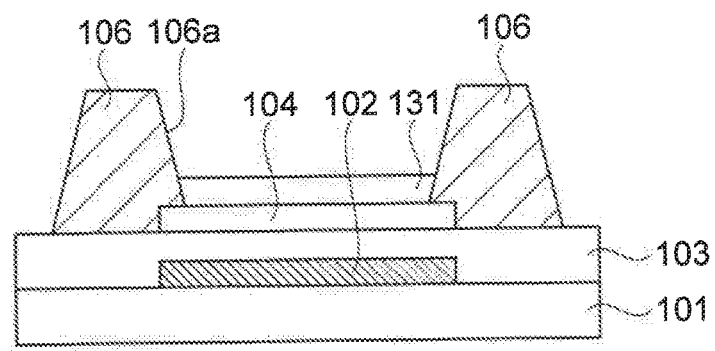
FIG. 3C is a schematic cross-sectional view showing a method for producing an organic EL element.

Next, a method for producing the organic EL element 130 using an inkjet method will be described with reference to FIGS. 3A, 3B, and 3C. FIGS. 3A, 3B, and 3C are schematic cross-sectional views showing a method for producing an organic EL element. The organic EL device 100 of this embodiment is produced using a method for producing the organic EL element 130 described below. Incidentally, for the production of the reflection layer 102, the pixel electrode 104, and a pixel circuit which drives and controls the organic EL element 130, a known method can be adopted, and therefore, a step of forming a partition wall and the subsequent steps will be described here.

The method for producing the organic EL element 130 includes a partition wall formation step (Step S1), a surface treatment step (Step S2), a functional layer formation step (Step S3), and a counter electrode formation step (Step S4). In particular, in the functional layer formation step, at least one layer in the functional layer 136 of the organic EL element 130 is formed using the ink composition including a first component which is a hydrophilic solvent, a second component which is a hydrophobic solvent, a third component which is an amphiphilic solvent, and a fourth component which includes a solute or a dispersing element as a functional layer forming material, and changing from one phase to two phases when the third component evaporates. The detailed configuration of the ink composition will be described later.

In Step S1 (the partition wall formation step), a photosensitive resin material is applied to the element substrate 101 on which the reflection layer 102 and the pixel electrode 104 are formed, followed by drying, whereby a photosensitive resin layer is formed thereon. Examples of the application method include a transfer method and a slit coating method. The formed photosensitive resin layer is exposed to light and developed using an exposure mask corresponding to the shape of the sub-pixel 110, whereby the partition wall 106 which overlaps with the outer edge of the pixel electrode 104, and also forms the opening portion 106a on the pixel electrode 104 is formed. A state where the partition wall 106 is formed is shown in FIG. 3A.

In Step S2 (the surface treatment step), the element substrate 101 on which the partition wall 106 is formed is subjected to a surface treatment. The surface treatment step is performed for the purpose of removing unnecessary materials such as partition wall residues on the surface of the pixel electrode 104 so that the ink composition wets and spreads uniformly in the opening portion 106a surrounded by the partition wall 106 when forming the hole injection layer 131, the hole transport layer 132, and the light-emitting layer 133 constituting the functional layer 136 by an inkjet method (liquid droplet ejection method) in the subsequent step. As a surface treatment method, for example, an excimer UV treatment can be applied. The surface treatment method is not limited to the excimer UV treatment and may be any as long as the surface of the pixel electrode 104 can be cleaned, and for example, a washing step using a solvent and a drying step may be included. If the surface of the pixel electrode 104 is in a clean state, it is not necessary to perform the surface treatment step.

In Step S3 (the functional layer formation step), as shown in FIG. 3B, an ink 150 including a hole injection layer material as a material for forming the hole injection layer 131 is applied to the opening portion 106a. As the method for applying the ink 150, an inkjet method in which the ink 150 is ejected as an ink droplet (liquid droplet D) from a nozzle 52 of an inkjet head 50 is used. The ejection amount of the liquid droplet D ejected from the inkjet head 50 is controlled in picoliter (pl) order, and the liquid droplets D whose number is calculated by dividing a predetermined amount by the ejection amount of the liquid droplet D are ejected to the opening portion 106a. Subsequently, the process proceeds to the drying step.

In the drying step, for example, decompression drying in which the element substrate 101 to which the ink 150 is applied is left under reduced pressure and dried by evaporating the solvent from the ink 150 is used (a decompression drying step). Thereafter, the ink 150 is solidified by, for example, heating and firing, whereby the hole injection layer 131 is formed as shown in FIG. 3C. The hole injection layer 131 is formed with a film thickness of about 10 nm to 30 nm, although not necessarily limited thereto in relation to the selection of the below-mentioned hole injection layer material or the other layers in the functional layer 136.

Subsequently, the hole transport layer 132 is formed using an ink 160 including a hole transport layer material as a material for forming the hole transport layer 132. Also in the method for forming the hole transport layer 132, an inkjet method is used similarly to the hole injection layer 131. The inkjet method is performed by ejecting a predetermined amount of the ink 160 as an ink droplet (liquid droplet D) from the nozzle 52 of the inkjet head 50 to the opening portion 106a. Then, the ink 160 applied to the opening portion 106a is dried under reduced pressure similarly to the hole injection layer 131. Thereafter, heating and firing are performed in an atmosphere of an inert gas such as nitrogen. Further, a soluble component of the hole injection layer material is removed using an organic solvent, whereby the hole transport layer 132 is formed. The hole transport layer 132 is formed with a film thickness of about 10 nm to 20 nm, although not necessarily limited thereto in relation to the selection of the below-mentioned hole transport layer material or the other layers in the functional layer 136. Further, the hole injection layer 131 and the hole transport layer 132 may be combined and formed as a hole injection transport layer in relation to the other layers in the functional layer 136.

Subsequently, the light-emitting layer 133 is formed using an ink 170 including a light-emitting layer material as a material for forming the light-emitting layer 133. Also in the method for forming the light-emitting layer 133, an inkjet method is used similarly to the hole injection layer 131. The inkjet method is performed by ejecting a predetermined amount of the ink 170 as an ink droplet (liquid droplet D) from the nozzle 52 of the inkjet head 50 to the opening portion 106a. Then, the ink 170 applied to the opening portion 106a is dried under reduced pressure similarly to the hole injection layer 131. Thereafter, heating and firing are performed in an atmosphere of an inert gas such as nitrogen, whereby the light-emitting layer 133 is formed. The light-emitting layer 133 is formed with a film thickness of about 60 nm to 80 nm, although not necessarily limited thereto in relation to the selection of the below-mentioned light-emitting layer material or the other layers in the functional layer 136.

Subsequently, an electron transport layer 134 is formed by covering the light-emitting layer 133. An electron transport layer material included in the electron transport layer 134 is not particularly limited, however, a forming material capable of using a gas phase process such as a vacuum deposition method can be used. Examples of such a forming material include BAlq, 1,3,5-tri(5-(4-tert-butylphenyl)-1,3,4-oxadiazole) (OXD-1), BCP (Bathocuproine), 2-(4-biphenyl)-5-(4-tert-butylphenyl)-1,2,4-oxadiazole (PBD), 3-(4-biphenyl)-5-(4-tert-butylphenyl)-1,2,4-triazole (TAZ), 4,4'-bis(1,1-bis-diphenylethenyl)biphenyl (DPVBi), 2,5-bis(1-naphthyl)-1,3,4-oxadiazole (BND), 4,4'-bis(1,1-bis(4-methylphenyl)ethenyl)biphenyl (DTVBi), and 2,5-bis(4-biphenyl)-1,3,4-oxadiazole (BBD).

Additional examples thereof include tris(8-quinolinolato) aluminum (Alq3), oxadiazole derivatives, oxazole derivatives, phenanthroline derivatives, anthraquinodimethane derivatives, benzoquinone derivatives, naphthoquinone derivatives, anthraquinone derivatives, tetracyanoanthraquinodimethane derivatives, fluorene derivatives, diphenyldicyanoethylene derivatives, diphenoquinone derivatives, and hydroxyquinoline derivatives. It is possible to use at least one type among these.

The electron transport layer 134 is formed with a film thickness of about 20 nm to 40 nm, although not necessarily limited thereto in relation to the selection of the above-mentioned electron transport layer material or the other layers in the functional layer 136. According to this, electrons injected from the cathode (counter electrode 105) can be preferably transported to the light-emitting layer 133. Incidentally, it is also possible to omit the electron transport layer 134 in relation to the other layers in the functional layer 136.

Subsequently, the electron injection layer 135 is formed by covering the electron transport layer 134. An electron injection layer material included in the electron injection layer 135 is not particularly limited, however, a forming material capable of using a gas phase process such as a vacuum deposition method can be used. Examples of such a forming material include alkali metal compounds and alkaline earth metal compounds.

Examples of the alkali metal compounds include alkali metal salts such as LiF, $Li_2CO_3$, LiCl, NaF, $Na_2CO_3$, NaCl, CsF, $Cs_2CO_3$, and CsCl. Examples of the alkaline earth metal compounds include alkaline earth metal salts such as $CaF_2$, $CaCO_3$, $SrF_2$, $SrCO_3$, $BaF_2$, and $BaCO_3$. It is possible to use at least one type among these alkali metal compounds and alkaline earth metal compounds.

The film thickness of the electron injection layer 135 is not particularly limited, but is preferably about 0.01 nm or more and 10 nm or less, more preferably about 0.1 nm or more and 5 nm or less. According to this, electrons can be efficiently injected from the cathode (counter electrode 105) to the electron transport layer 134.

Subsequently, in the counter electrode formation step of Step S4, the counter electrode 105 (cathode) is formed by covering the electron injection layer 135. As the material for forming the counter electrode 105, a forming material having a low work function and capable of using a gas phase process such as a vacuum deposition method can be used. Examples of such a forming material include Li, Mg, Ca, Sr, La, Ce, Er, Eu, Sc, Y, Yb, Ag, Cu, Al, Cs, Rb, Au, and an alloy containing any of these metals, and among these, it is possible to use one type or two or more types in combination (for example, as a stacked body of a plurality of layers, or the like).

As in this embodiment, in the case where the organic EL device 100 is a top emission type device, in particular, it is preferred to use a metal such as Mg, Al, Ag, or Au, or an alloy such as MgAg, MgAl, MgAu, or AlAg as the material for forming the counter electrode 105. It is possible to achieve the improvement of the electron injection efficiency and stability of the counter electrode 105 while ensuring the light transmission property of the counter electrode 105 by using such a metal or an alloy. The film thickness of the counter electrode 105 in the top emission type device is not particularly limited, but is preferably about 1 nm or more and 50 nm or less, more preferably about 5 nm or more and 20 nm or less.

In the case where the organic EL device 100 is a bottom emission type device, a light transmission property is not required for the counter electrode 105. Therefore, for example, a metal or an alloy such as Al, Ag, AlAg, or AlNd is used as the forming material. By using such a metal or an alloy as the material for forming the counter electrode 105, the electron injection efficiency and stability of the counter electrode 105 can be improved. The film thickness of the counter electrode 105 in the bottom emission type device is not particularly limited, but is preferably about 50 nm or more and 1000 nm or less, more preferably about 100 nm or more and 500 nm or less.

By the production method described above, the organic EL element 130 (see FIG. 2) is formed. In the organic EL element 130, when, for example, moisture, oxygen, or the like enters from the outside, the light-emitting function in the functional layer 136 is impaired, and the emission brightness is partially lowered, or a dark point (dark spot) which does not emit light is generated. There is also a fear that the emission lifetime is shortened. Therefore, in order to prevent moisture, oxygen, or the like from entering the element, it is preferred to cover the organic EL element 130 with a sealing layer (not shown). As a material for forming the sealing layer, an inorganic insulating material such as silicon oxynitride (SiON) with low permeability to water, oxygen, or the like can be used. Further, the organic EL element 130 may be sealed by, for example, attaching a sealing substrate such as a transparent glass to the element substrate 101 on which the organic EL element 130 is formed through an adhesive.

In the above-mentioned method for producing the functional layer 136, the hole injection layer 131, the hole transport layer 132, and the light-emitting layer 133 are formed by a liquid phase process (inkjet method), however, at least one of these layers may be formed by a liquid phase process (inkjet method), and the other layers may be formed using a gas phase process such as vacuum deposition. Further, the electron transport layer 134 or the electron injection layer 135 may be formed by a liquid phase process (inkjet method).

As described above, in the inkjet method to be used for forming the functional layer 136, the ejection amount of the liquid droplet D is controlled in picoliter (pl) order. Due to this, it is necessary to continuously and stably eject the liquid droplet D, and therefore, it is demanded that the ink composition to be used be a liquid in which the ink components are hardly separated and the composition is stable.

Inkjet Head

Figure 4:
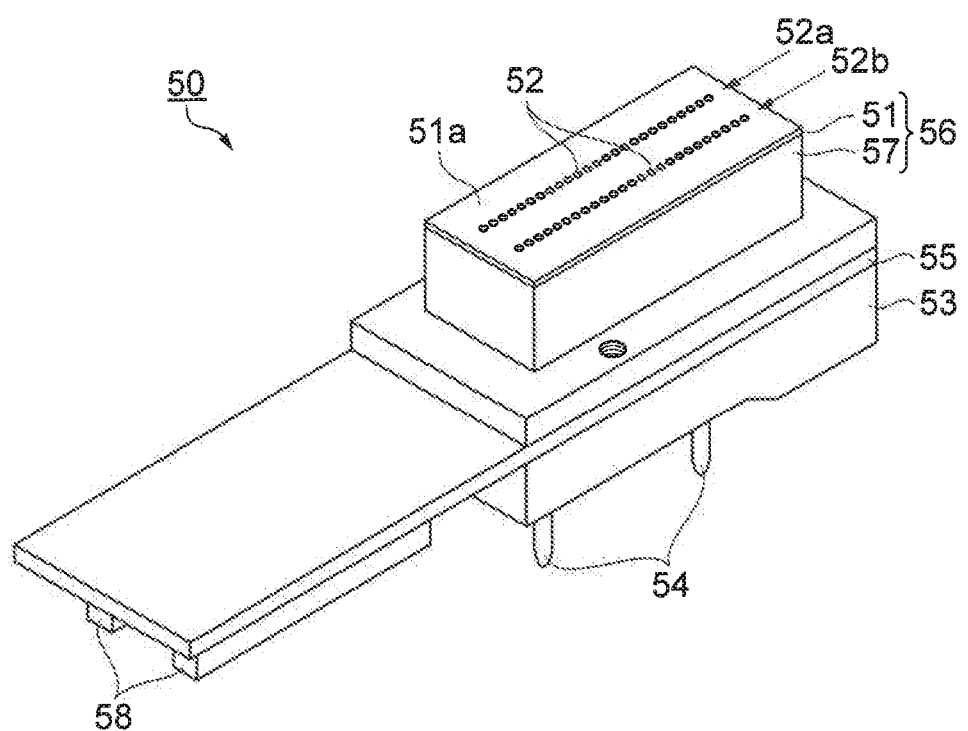
FIG. 4 is a schematic perspective view showing a configuration of an inkjet head.

The outline of the inkjet head according to this embodiment will be described with reference to FIG. 4. FIG. 4 is a schematic perspective view showing a configuration of the inkjet head.

The inkjet head 50 shown in FIG. 4 includes an introduction portion 53, a head substrate 55, a head main body 56, and the like. The introduction portion 53 has a function of an ink introduction portion in the inkjet head 50. In this introduction portion 53, double connection needles 54 are provided. The connection needles 54 are connected to an ink supply mechanism (not shown) through a pipe, and have a function to supply the ink composition into the inkjet head 50.

The head substrate 55 is placed such that one surface is adjacent to the introduction portion 53 and the other surface faces the head main body 56. Further, in this head substrate 55, double connectors 58 are provided. The connectors 58 include terminals for electrically connecting a circuit substrate (not shown) to the inkjet head 50 through a flexible flat cable (not shown).

The head main body 56 is placed adjacent to the head substrate 55, and a flow channel of the ink introduced from the connection needle 54 is formed therein. This head main body 56 includes a pressurization portion 57 and a nozzle plate 51. In the pressurization portion 57, a piezoelectric element is placed in a cavity portion (not shown) as a driving unit (actuator) of the inkjet head 50.

On the surface of the nozzle plate 51, to which the inkjet head 50 ejects the ink composition as the liquid droplet D, a nozzle surface 51a is formed. On this nozzle surface 51a, two nozzle rows 52a and 52b in which a plurality of nozzles 52 are arranged at predetermined intervals are placed in parallel with each other. Since the two nozzle rows 52a and 52b are placed, the inkjet head 50 has a configuration of so-called double nozzle arrangement. Further, the nozzle 52 has a circular shape, and the diameter thereof is set to about 30 μm. The cavity portion is provided for each of these nozzles 52.

According to the above-mentioned configuration, the ink composition is supplied and filled in the inkjet head 50 from the ink supply mechanism. Subsequently, when a driving signal (electrical signal) is applied to the piezoelectric element in the inkjet head 50 from a head driver (not shown), a volume change occurs in the cavity in the pressurization portion 57 by the deformation of the piezoelectric element. The ink composition filled in the cavity is pressurized by the action of a pump by this volume change and is ejected as the liquid droplet D from the nozzle 52.

The driving unit (actuator) placed for each nozzle 52 of the inkjet head 50 is not limited to the piezoelectric element. For example, an electromechanical conversion element which displaces a vibrator plate as the actuator by electrostatic adsorption or an electrothermal conversion element which ejects the ink composition as an ink droplet by an air bubble generated by heating may also be used. Further, the inkjet head 50 is mounted on a carriage (not shown) which freely reciprocates and therefore is configured to be able to scan relative to the element substrate 101 (see FIG. 1).

Ink Composition Including Functional Layer Forming Material

The ink composition to be ejected as the liquid droplet D from the above-mentioned inkjet head 50 will be described.

The ink composition according to this embodiment includes a first component which is a hydrophilic solvent, a second component which is a hydrophobic solvent, a third component which is an amphiphilic solvent, and a fourth component which includes a solute or a dispersing element, and changes from one phase to two phases when the third component evaporates. Further, the normal boiling point of the third component is lower than the normal boiling point of the first component and the normal boiling point of the second component, and the normal boiling point of the first component is lower than the normal boiling point of the second component, and the specific gravity of the first component is larger than the specific gravity of the second component. Further, the content of the second component with respect to the total mass of the ink composition is 10 mass % or more and 90 mass % or less, the content of the third component with respect to the total mass is 0.1 mass % or more and 50 mass % or less, and the content of the fourth component with respect to the total mass is 5 mass % or less.

In this specification, the "hydrophilic solvent" refers to a solvent which is miscible with water at 25° C. at an arbitrary ratio, the "hydrophobic solvent" refers to a solvent which is not miscible with water at 25° C. at an arbitrary ratio and is miscible with normal hexane at 25° C. at an arbitrary ratio, and the "amphiphilic solvent" refers to a solvent which is miscible with both water at 25° C. and normal hexane at 25° C. at an arbitrary ratio.

The ink composition of this embodiment satisfies a relative relationship of the first component, the second component, the third component, and the fourth component described above. That is, the ink composition of this embodiment is at least one type of the ink 150 (including a hole injection layer material), the ink 160 (including a hole transport layer material), and the ink 170 (including a light-emitting layer material). Therefore, examples of the solute or the dispersing element included in the fourth component include functional layer forming materials such as a hole injection layer material, a hole transport layer material, and a light-emitting layer material.

Hole Injection Transport Layer Materials (HIL Material and HTL Material)

Preferred hole injection transport layer materials for forming the hole injection layer 131 and the hole transport layer 132 are not particularly limited, however, various types of p-type high-molecular materials and various types of p-type low-molecular materials can be used alone or by combining two or more types.

Examples of the p-type high-molecular materials (organic polymers) include aromatic amine-based compounds having an arylamine skeleton such as polyarylamines including poly(2,7-(9,9-di-n-octylfluorene)-(1,4-phenylene-((4-sec-butylphenyl)imino)-1,4-phen ylene (TFB) and the like, polyfluorene derivatives (PF) having a fluorene skeleton such as a fluorene-bithiophene copolymer and polyfluorene derivatives (PF) having both of an arylamine skeleton and a fluorene skeleton such as a fluorene-arylamine copolymer, poly(N-vinylcarbazole) (PVK), polyvinyl pyrene, polyvinyl anthracene, polythiophene and derivatives thereof, polyalkylthiophene, polyhexylthiophene, poly(p-phenylene vinylene) (PPV), polythienylene vinylene, a pyrene formaldehyde resin, an ethylcarbazole formaldehyde resin and derivatives thereof, polysilane-based compounds such as polymethylphenylsilane (PMPS), poly[bis(4-phenyl)(2,4,6-trimethylphenyl)amine (PTTA), poly[N,N'-bis(4-butylphenyl)-N,N'-bis(phenyl)-benzidine], fluorine-based high-molecular compounds such as Nafion (registered trademark), a high-molecular compound described in Example 1 of Patent Document WO 2007/043607 (A1), and polypyrrole derivatives such as poly-1-methylpyrrole, poly-3-methylpyrrole, poly-1-ethylpyrrole, poly-3-ethylpyrrole, poly-1-methoxypyrrole, poly-3-methoxypyrrole, poly-1-ethoxypyrrole, poly-3-ethoxypyrrole, and poly-3-phenylpyrrole.

Such a p-type high-molecular material can also be used as a mixture with another compound. For example, as a mixture containing polythiophene such as poly(3,4-ethylenedioxythiophene)/polystyrene sulfonic acid) (PEDOT/PSS) or an electrically conductive polymer VERAZOL (trademark) manufactured by Soken Chemical & Engineering Co., Ltd., polyaniline such as ELsource (trademark) manufactured by Nissan Chemical Industries, Ltd. or the like can be used.

Examples of the p-type low-molecular materials include arylcycloalkane-based compounds such as 1,1-bis(4-di-para-tolylaminophenyl)cyclohexane and 1,1'-bis(4-di-para-tolylaminophenyl)-4-phenyl-cyclohexane (TAPC), arylamine-based compounds such as 4,4',4"-trimethyltriphenylamine, N,N'-diphenyl-N,N'-bis(3-methylphenyl)-1,1'-biphenyl-4,4'-diamine (TPD), N,N,N',N'-tetraphenyl-1,1'-biphenyl-4,4'-diamine, N,N'-diphenyl-N,N'-bis(3-methylphenyl)-1,1'-biphenyl-4,4'-diamine (TPD1), N,N'-diphenyl-N,N'-bis(4-methoxyphenyl)-1,1'-biphenyl-4,4'-diamine (TPD2), N,N,N',N'-tetrakis(4-methoxyphenyl)-1,1'-biphenyl-4,4'-diamine (TPD3), N,N'-bis-(1-naphthyl)-N,N'-diphenyl-1,1'-biphenyl-4,4'-diamine (α-NPD), a triphenylamine tetramer (TPTE), 1,3,5-tris[4-(diphenylamino)benzene (TDAPB), tris(4-(carbazol-9-yl) phenyl)amine (spiro-TAD), tris-para-tolylamine (HTM1), 1,1-bis[(di-4-tolylamino) phenyl]cyclohexane (HTM2), and N4,N4'-(biphenyl-4,4'-diyl)bis(N4,N4',N4'-triphenylbiphenyl-4,4'-diamine) (TPT1), phenylenediamine-based compounds such as N,N,N',N'-tetraphenyl-para-phenylenediamine, N,N,N',N'-tetra(para-tolyl)-para-phenylenediamine, N,N,N',N'-tetra(meta-tolyl)-meta-phenylenediamine (PDA), PDA-Si (Mol. Cryst. Liq. Cryst. Vol. 462. pp. 249-256, 2007), and N,N'-diphenyl-1,4-phenylenediamine (DPPD), carbazole-based compounds such as carbazole, N-isopropylcarbazole, N-phenylcarbazole, and VB-TCA (Adv. Mater. 2007, 19, 300-304), stilbene-based compounds such as stilbene and 4-di-para-tolylaminostilbene, oxazole-based compounds such as OxZ, triphenylmethane-based compounds such as triphenylmethane, 4,4',4"-tris(N-3-methylphenyl-N-phenylamino)triphenylamine (m-MTDATA), 4,4',4"-tris(N,N-(2-naphthyl)phenylamine (2-TNATA), and 4,4',4"-tri(N-carbazolyl)triphenylamine (TCTA), pyrazoline-based compounds such as 1-phenyl-3-(para-dimethylaminophenyl)pyrazoline, benzine (cyclohexadiene)-based compounds, triazole-based compounds such as triazole, imidazole-based compounds such as imidazole, oxadiazole-based compounds such as 1,3,4-oxadiazole and 2,5-di(4-dimethylaminophenyl)-1,3,4-oxadiazole, anthracene-based compounds such as anthracene and 9-(4-diethylaminostyryl)anthracene, fluorenone-based compounds such as fluorenone, 2,4,7-trinitro-9-fluorenone, and 2,7-bis(2-hydroxy-3-(2-chlorophenylcarbamoyl)-1-naphthylazo)fluorenone, aniline-based compounds such as polyaniline, silane-based compounds, pyrrole-based compounds such as 1,4-dithio-keto-3,6-diphenyl-pyrrolo-(3,4-c)pyrrolopyrrole, fluorene-based compounds such as fluorene, porphyrin-based compounds such as porphyrin and metal tetraphenyl porphyrins, quinacridone-based compounds such as quinacridone, metal or non-metal phthalocyanine-based compounds such as phthalocyanine, copper phthalocyanine (CuPc), tetra(t-butyl) copper phthalocyanine, and iron phthalocyanine, metal or non-metal naphthalocyanine-based compounds such as copper naphthalocyanine, vanadyl naphthalocyanine, and monochloro gallium naphthalocyanine, and benzidine-based compounds such as N,N'-di(naphthalen-1-yl)-N,N'-diphenyl-benzidine and N,N,N',N'-tetraphenylbenzidine. Incidentally, PDA-Si is used by adding a cationic polymerizable compound: xylene bisoxetane (ARONE OXETANE OXT-121, Toagosei Co., Ltd.) and a radical polymerization initiator: an aliphatic diacyl peroxide (PEROYL L, NOF Corporation) in order to achieve polymerization.

In this embodiment, in the case where the hole injection layer 131 or the hole transport layer 132 is formed using the ink composition of this embodiment, as the fourth component (the solute or the dispersing element), it is preferred to use a material which can be dissolved or dispersed (has solubility or dispersibility) in the first component (hydrophilic solvent) among the above-mentioned hole injection transport layer materials. According to this, in an ink droplet formed by the ink composition, when the third component (amphiphilic solvent) evaporates, since the specific gravity of the hydrophilic solvent (first component) is larger than the specific gravity of the second component (hydrophobic solvent), the following two layers: a lower layer mainly including the hydrophilic solvent (first component) and the fourth component; and an upper layer mainly including the hydrophobic solvent (second component) can be formed.

Red Light-Emitting Material

Next, a light-emitting layer material (EML material) from which fluorescence or phosphorescence is obtained will be described by showing specific examples for each light emission color. A red light-emitting material (red EML material) is not particularly limited, and at least one type selected from various types of red fluorescent materials and red phosphorescent materials can be used.

The red fluorescent material is not particularly limited as long as it emits red fluorescence, and examples thereof include perylene derivatives, europium complexes, benzopyran derivatives, rhodamine derivatives, benzothioxanthene derivatives, porphyrin derivatives, nile red, 2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4H-ylidene)propanedinitrile (DCJTB), 4-(dicyanomethylene)-2-methyl-6-(p-dimethylaminostyryl)-4H-pyran (DCM), poly[2-methoxy-5-(2-ethylhexyloxy)-1,4-(1-cyanovinylenephenylene)], poly[{9,9-dihexyl-2,7-bis(1-cyanovinylene)fluorenylene}-alt-co-{2,5-bis(N,N'-diphenylamino)-1,4-phenylene}], and poly[{2-methoxy-5-(2-ethylhexyloxy)-1,4-(1-cyanovinylenephenylene)}-co-{2,5-bis(N,N'-diphenylamino)-1,4-phenylene}].

The red phosphorescent material is not particularly limited as long as it emits red phosphorescence, and examples thereof include metal complexes such as complexes of iridium, ruthenium, platinum, osmium, rhenium, and palladium, and metal complexes in which at least one of the ligands of such a metal complex has a phenylpyridine skeleton, a bipyridyl skeleton, a porphyrin skeleton, or the like. More specific examples thereof include tris(1-phenylisoquinoline)iridium, bis[2-(2'-benzo[4,5-α]thienyl)pyridinato-N,C3']iridium (acetylacetonate) (btp2Ir(acac)), 2,3,7,8,12,13,17,18-octaethyl-12H,23H-porphyrin-platinum (II), bis(2-(2'-benzo[4,5-a]thienyl)-pyridinato-N,C3' iridium, and bis(2-phenylpyridine)iridium (acetylacetonate).

Further, the red light-emitting layer 133 may contain, in addition to the above-mentioned red light-emitting material, a host material to which the red light-emitting material is added as a guest material. The host material has a function to generate an exciton by recombining a hole and an electron with each other, and also to excite the red light-emitting material by transferring the energy of the exciton to the red light-emitting material (Forster transfer or Dexter transfer). In the case where such a host material is used, for example, the red light-emitting material which is the guest material can be used by doping the host material with the red light-emitting material as a dopant.

Such a host material is not particularly limited as long as it has a function as described above for the red light-emitting material to be used, however, in the case where the red light-emitting material contains a red fluorescent material, examples thereof include acene derivatives (acene-based materials) such as naphthacene derivatives, naphthalene derivatives, and anthracene derivatives, distyrylarylene derivatives, perylene derivatives, distyrylbenzene derivatives, distyrylamine derivatives, quinolinolate-based metal complexes (BAql) such as tris(8-quinolinolato)aluminum complex (Alq3), triarylamine derivatives (TDAPB) such as triphenylamine tetramers, oxadiazole derivatives, silole derivatives (SimCP and UGH3), dicarbazole derivatives (CBP, mCP, CDBP, and DCB), oligothiophene derivatives, benzopyran derivatives, triazole derivatives, benzoxazole derivatives, benzothiazole derivatives, quinoline derivatives, and 4,4'-bis(2,2'-diphenylvinyl)biphenyl (DPVBi), and phosphorus derivatives (PO6). Among these, it is possible to use one type or two or more types in combination.

In the case where the red light-emitting material (guest material) and the host material as described above are used, the content (doping amount) of the red light-emitting material in the red light-emitting layer 133 is preferably from 0.01 mass % to 10 mass %, more preferably from 0.1 mass % to 5 mass %. By setting the content of the red light-emitting material within such a range, the current efficiency (luminous efficiency) can be optimized.

Green Light-Emitting Material

A green light-emitting material (green EML material) is not particularly limited, and examples thereof include various types of green fluorescent materials and green phosphorescent materials, and it is possible to use at least one type among these.

The green fluorescent material is not particularly limited as long as it emits green fluorescence, and examples thereof include coumarin derivatives, quinacridone and derivatives thereof, 9,10-bis[(9-ethyl-3-carbazole)-vinylenyl]-anthracene, poly(9,9-dihexyl-2,7-vinylenefluorenylene), poly[(9,9-dioctylfluoren-2,7-diyl)-co-(1,4-diphenylene-vinylene-2-methoxy-5-{2-ethyl hexyloxy}benzene)], poly[(9,9-dioctyl-2,7-divinylenefluorenylene)-alt-co-(2-methoxy-5-(2-ethoxylhexyloxy)-1,4-phenylene)], and poly[(9,9-dioctylfluoren-2,7-diyl)-alt-co-(1,4-benzo-{2,1',3}-thiadiazole)] (F8BT).

The green phosphorescent material is not particularly limited as long as it emits green phosphorescence, and examples thereof include metal complexes such as complexes of iridium, ruthenium, platinum, osmium, rhenium, and palladium, and specific examples thereof include fac-tris(2-phenylpyridine)iridium (Ir(ppy)3), bis(2-phenylpyridinato-N,C2')iridium (acetylacetonate), and fac-tris [5-fluoro-2-(5-trifluoromethyl-2-pyridine)phenyl-C,N] iridium.

Further, the green light-emitting layer 133 may contain, in addition to the above-mentioned green light-emitting material, a host material to which the green light-emitting material is added as a guest material. As such a host material, the same host materials as those described for the above-mentioned red light-emitting layer 133 can be used.

Blue Light-Emitting Material

Examples of a blue light-emitting material (blue EML material) include various types of blue fluorescent materials and blue phosphorescent materials, and it is possible to use at least one type among these.

The blue fluorescent material is not particularly limited as long as it emits blue fluorescence, and examples thereof include distyrylamine derivatives such as distyryldiamine-based compounds, fluoranthene derivatives, pyrene derivatives, perylene and perylene derivatives, anthracene derivatives, benzoxazole derivatives, benzothiazole derivatives, benzoimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl (BCzVBi), poly[(9,9-dioctylfluoren-2,7-diyl)-co-(2,5-dimethoxybenzen-1,4-diyl)], poly[(9,9-dihexyloxyfluoren-2,7-diyl)-alt-co-(2-methoxy-5-{2-ethoxylhexyloxy}phenylen-1,4-diyl)], poly[(9,9-dioctylfluoren-2,7-diyl)-co-(ethynylbenzene)], and poly[(9,9-dioctylfluoren-2,7-diyl)-co-(N,N'-diphenyl)-N,N'-di(para-butylphenyl)-1,4-diamino-benzene]].

The blue phosphorescent material is not particularly limited as long as it emits blue phosphorescence, and examples thereof include metal complexes such as complexes of iridium, ruthenium, platinum, osmium, rhenium, and palladium, and specific examples thereof include bis[4,6-difluorophenylpyridinato-N,C2']-picolinate-iridium (FIrpic), tris(1-phenyl-3-methylbenzimidazolin-2-ylidene-C,C2') (Ir(pmb)3), bis(2,4-difluorophenylpyridinato)(5-(pyridin-2-yl)-1H-tetrazole)iridium (FIrN4), tris[2-(2,4-difluorophenyl)pyridinato-N,C2']iridium, bis[2-(3,5-trifluoromethyl)pyridinato-N,C2']-picolinate-iridium, and bis(4,6-difluorophenylpyridinato-N,C2')iridium (acetylacetonate).

Further, the blue light-emitting layer 133 may contain, in addition to the above-mentioned blue light-emitting material, a host material to which the blue light-emitting material is added as a guest material. As such a host material, the same host materials as those described for the above-mentioned red light-emitting layer 133 can be used.

In this embodiment, in the case where the light-emitting layer 133 is formed using the ink composition of this embodiment, as the fourth component (the solute or the dispersing element), it is preferred to use a material which can be dissolved or dispersed (has solubility or dispersibility) in the first component (hydrophilic solvent) among the above-mentioned light-emitting layer materials. According to this, in an ink droplet formed by the ink composition, when the third component (amphiphilic solvent) evaporates, since the specific gravity of the hydrophilic solvent (first component) is larger than the specific gravity of the second component (hydrophobic solvent), the following two layers: a lower layer mainly including the hydrophilic solvent (first component) and the fourth component; and an upper layer mainly including the hydrophobic solvent (second component) can be formed.

Next, the hydrophilic solvent (first component), the hydrophobic solvent (second component), and the amphiphilic solvent (third component) included in the ink composition according to this embodiment will be described.

Hydrophilic Solvent

The first component which is a hydrophilic solvent is selected according to the solubility or dispersibility of the fourth component and the relative relationship with the second component and the third component as described above. As the first component, it is preferred to include a glycol ether compound or an alkanediol compound. Examples of the glycol ether compound include diethylene glycol (DEG), dipropylene glycol (DPG), triethylene glycol (TEG), tetraethylene glycol (TetraEG), triethylene glycol monobutyl ether, diethylene glycol monomethyl ether, triethylene glycol monomethyl ether, diethylene glycol monoisopropyl ether, ethylene glycol monobutyl ether, diethylene glycol monobutyl ether, ethylene glycol monoisobutyl ether, diethylene glycol monoisobutyl ether, ethylene glycol monohexyl ether, diethylene glycol monohexyl ether, ethylene glycol mono-2-ethylhexyl ether, diethylene glycol mono-2-ethylhexyl ether, ethylene glycol monoallyl ether, dipropylene glycol monomethyl ether, dipropylene glycol monopropyl ether, propylene glycol monobutyl ether, and dipropylene glycol monobutyl ether. Examples of the alkanediol compound include 1,2-ethanediol (12ED), 1,2-propanediol (12PD), 1,3-butanediol (13BD), 1,4-butanediol (14BD), 2,3-butanediol (23BD), 1,5-pentanediol, 2-methyl-2,4-pentanediol (2M24PD), 1,6-hexanediol, and 2-ethyl-1,3-hexanediol (2E13HD). It is preferred to use at least one type among the hydrophilic solvents listed above.

Further, as the first component, in addition to the above-mentioned hydrophilic solvents, a glycol diether compound or a cyclic ester compound may be used. Examples of the glycol diether compound include diethylene glycol methyl ethyl ether, diethylene glycol diethyl ether, diethylene glycol butyl methyl ether, diethylene glycol dibutyl ether, triethylene glycol dimethyl ether, tripropylene glycol dimethyl ether, and tetraethylene glycol dimethyl ether, and examples of the cyclic ester compound include γ-butyrolactone.

Hydrophobic Solvent

The second component which is a hydrophobic solvent is selected according to the relative relationship with the first component and the third component as described above. As the second component, it is preferred to include an aromatic hydrocarbon compound or a heterocyclic compound. Examples of the aromatic hydrocarbon compound include hexylbenzene, heptylbenzene, octylbenzene, nonylbenzene, decylbenzene, undecylbenzene, dodecylbenzene, diisopropylbenzene (DIPB), cyclohexylbenzene (CHB), diphenyl ether (DPE), 3-phenoxytoluene (3PT), and bisdimethylphenylethane (BDMPE). Examples of the heterocyclic compound include 2,3-dihydrobenzofuran, 2,3-dihydro-2-methylbenzofuran, 2,3-dihydro-2-ethylbenzofuran, and 2-methylbenzofuran. It is preferred to use at least one type among the hydrophobic solvents listed above.

Further, as the second component, in addition to the above-mentioned hydrophobic solvents, an aliphatic hydrocarbon compound may be used. Examples of the aliphatic hydrocarbon compound include chain hydrocarbon compounds such as decane, undecane, dodecane, tridecane, tetradecane, pentadecane, and hexadecane, and cyclic hydrocarbon compounds such as naphthene-based compounds. As such a hydrocarbon compound, a commercially available compound may be used as a mixture as long as it satisfies the relative relationship with the first component and the third component described above. Specific examples thereof include NS Clean (200, 220, and 230) (trademark) manufactured by JXTG Nippon Oil & Energy Corporation, Naphthesol (grade 160, 200, and 220) (trademark) manufactured by JXTG Nippon Oil & Energy Corporation, and IP Solvent (1620 and 2028) manufactured by Idemitsu Kosan Co., Ltd.

Amphiphilic Solvent

The third component which is an amphiphilic solvent is selected according to the relative relationship with the hydrophilic solvent (first component) and the hydrophobic solvent (second component) as described above. Further, it is preferred that the solubility of the third component in the hydrophilic solvent (first component) or the hydrophobic solvent (second component) is 0.1 mass % or more. As the third component, it is preferred to include a monoalcohol compound having 4 or more carbon atoms or an alkanone compound having 4 or more carbon atoms. Examples of the monoalcohol compound having 4 or more carbon atoms include 1-butanol, 1-pentanol, 1-hexanol, 1-heptanol, 1-octanol, and 1-nonanol. Examples of the alkanone compound having 4 or more carbon atoms include 2-butanone, 2-hexanone, 2-heptanone, 2-octanone, 2-nonanone, 2-decanone, 2-undecanone, and 2-dodecanone. It is preferred to use at least one type among the amphiphilic solvents (third components) listed above.

Film Formation Behavior of Ink Composition

Film Formation Behavior of Ink Composition in Related Art

A film formation behavior of an ink composition in the related art will be described with reference to FIGS. 5A, 5B, 5C, 5D, 6A, 6B, 6C, and 6D. FIGS. 5A to 5D and FIGS. 6A to 6D are schematic views showing a film formation behavior of an ink composition in the related art.

FIGS. 5A to 5D show a film formation behavior of an ink composition 12 in which the drying of the solvent is fast among the ink compositions in the related art. The "ink composition 12 in which the drying of the solvent is fast" refers to, for example, an ink composition including a low-boiling point solvent having a normal boiling point of about 240° C. or lower in an amount of 1 mass % or more with respect to the total mass.

Figure 5A:
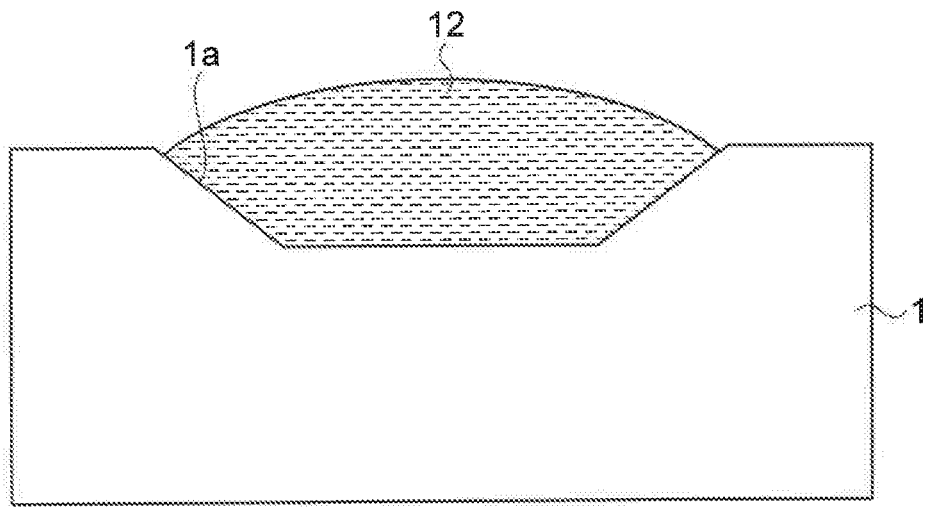
FIG. 5A is a schematic view showing a film formation behavior of an ink composition in the related art.

As shown in FIG. 5A, to an opening portion 1a of a base material 1, the ink composition 12 including a solid component such as a functional layer forming material as the fourth component is applied. Here, the opening portion 1a has a shape similar to the opening portion 106a of the organic EL element 130 described above. Further, the solid component is assumed to have solubility or dispersibility in the hydrophilic solvent (first component) so as to be dissolved or dispersed in the ink composition 12. In the following description using the base material 1, gravity is assumed to act in the direction from the opening portion 1a to the base material 1 (the direction from the upper side to the lower side in FIG. 5A or the like).

Figure 5B:
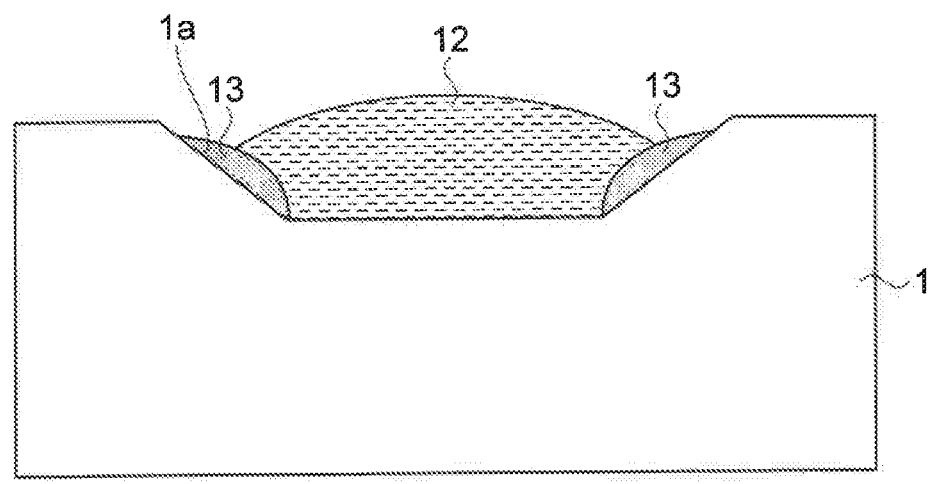
FIG. 5B is a schematic view showing a film formation behavior of an ink composition in the related art.

First, when the solvent of the ink composition 12 evaporates and drying starts, the concentration of the solid component near the gas-liquid interface (the boundary surface between the gas phase and the liquid phase) of the ink composition 12 becomes larger than the concentration of the solid component in the bulk. This difference in the concentration of the solid component is mitigated by convection in the ink composition 12, however, the drying of the solvent of the ink composition 12 is fast, and therefore, the mitigation action cannot catch up and the difference in the concentration of the solid component increases. Due to this, the concentration of the solid component locally exceeds the saturation solubility, and therefore, the solid component 13 is deposited. As shown in FIG. 5B, the solid component 13 is generated with the gas-liquid interface at the boundary between the ink composition 12 and the opening portion 1a as the starting point.

Figure 5C:
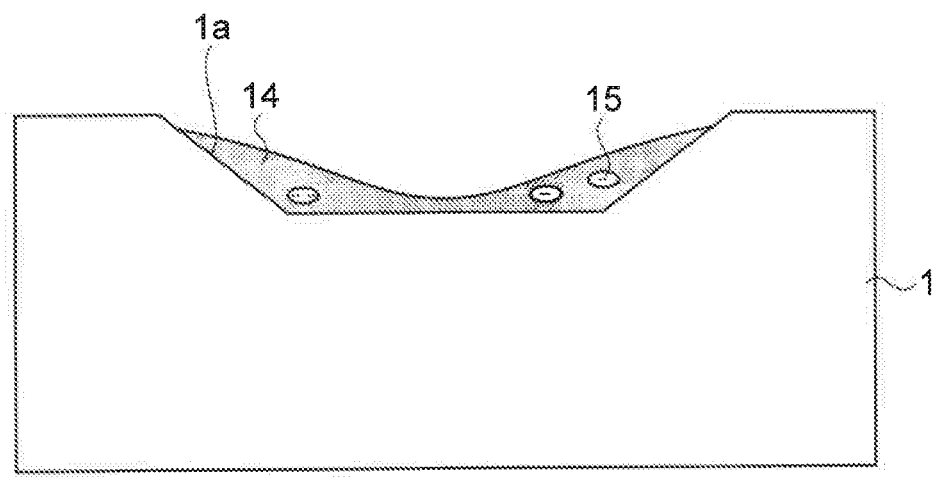
FIG. 5C is a schematic view showing a film formation behavior of an ink composition in the related art.

Subsequently, as shown in FIG. 5C, when the evaporation of the solvent proceeds, the solid component 13 grows and the functional layer 14 is formed. The above-mentioned starting point (gas-liquid interface) becomes an edge portion of the functional layer 14, and therefore, the functional layer 14 is formed into such a shape that a central portion is recessed with respect to the edge portion. Due to this, in the functional layer 14, the film thickness in the central portion is thinner than on the opening portion 1a side, and the uniformity of the film thickness is poor. At this time, the residual solvent 15 is present inside the functional layer 14. In FIG. 5C, the residual solvent 15 is shown locally, but is not limited thereto. The residual solvent 15 is uniformly distributed in the functional layer 14 in some cases. Also in the following description, the residual solvent is shown locally, but the same applies to the following description.

Figure 5D:
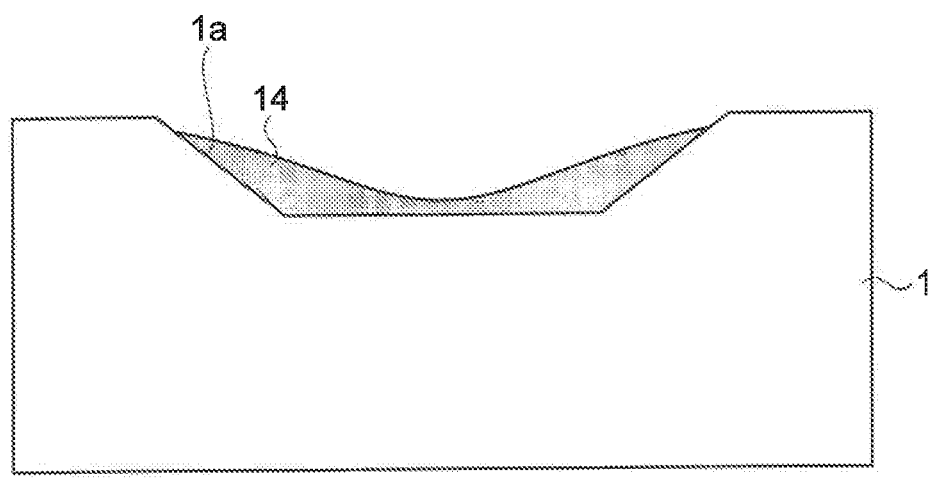
FIG. 5D is a schematic view showing a film formation behavior of an ink composition in the related art.

Subsequently, the residual solvent 15 is reduced by vacuum drying or the like. As shown in FIG. 5D, since the drying of the solvent is fast (the normal boiling point is low), the residual solvent 15 is easily reduced, however, the recessed shape in the center of the functional layer 14 is not improved. Therefore, in the functional layer 14, the uniformity of the film thickness is poor, and it becomes difficult to obtain desired properties.

FIGS. 6A to 6D show a film formation behavior of an ink composition 22 in which the drying of the solvent is slow among the ink compositions in the related art. The "ink composition 22 in which the drying of the solvent is slow" refers to, for example, an ink composition including a high-boiling point solvent having a normal boiling point of about 250° C. or higher in an amount of 1 mass % or more with respect to the total mass.

Figure 6A:
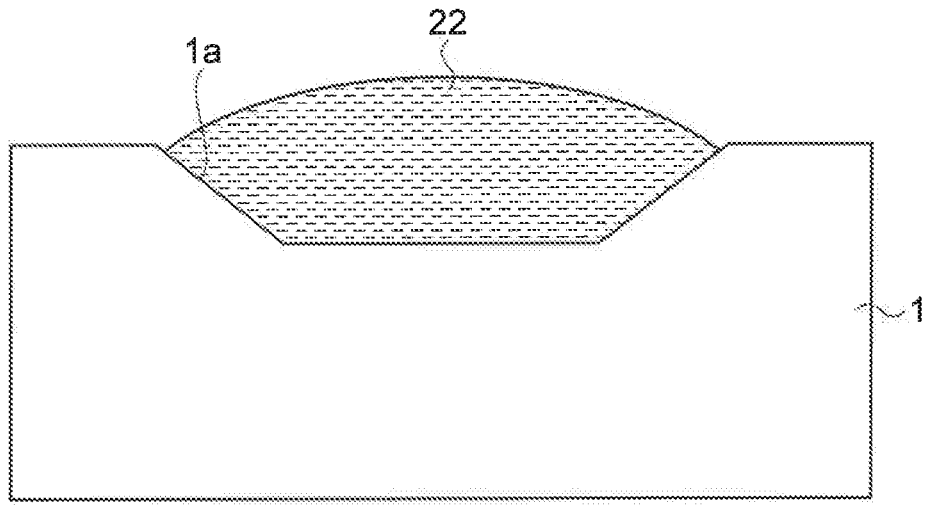
FIG. 6A is a schematic view showing a film formation behavior of an ink composition in the related art.

As shown in FIG. 6A, to an opening portion 1a of a base material 1, the ink composition 22 including the same solid component in the same amount as the ink composition 12 is applied. Here, the solid component is assumed to be dissolved or dispersed in the ink composition 22.

Figure 6B:
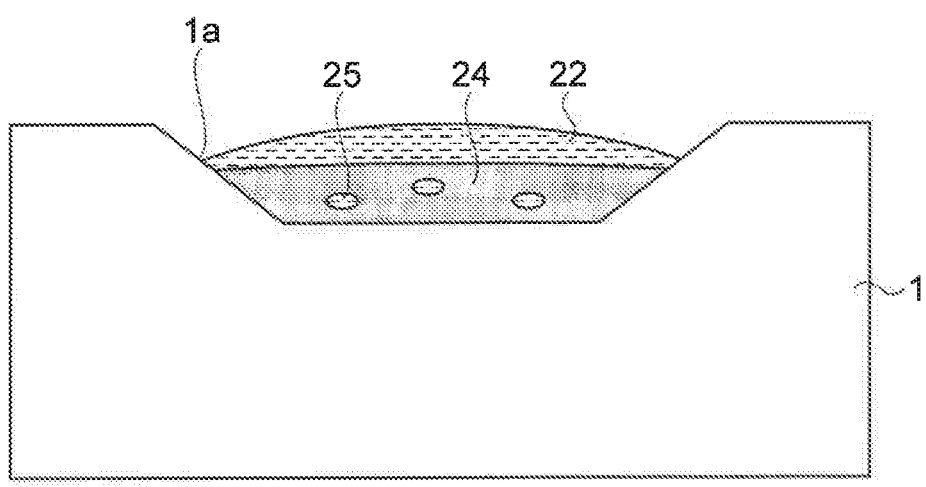
FIG. 6B is a schematic view showing a film formation behavior of an ink composition in the related art.

First, when the solvent of the ink composition 22 evaporates and drying starts, the concentration of the solid component near the gas-liquid interface of the ink composition 22 becomes larger than the concentration of the solid component in the bulk. This difference in the concentration of the solid component is sufficiently mitigated by convection in the ink composition 22 because the drying of the solvent of the ink composition 22 is slow. Therefore, local non-uniformity of the concentration of the solid component hardly occurs unlike the ink composition 12, and the condensation of the solid component gradually proceeds. Then, when the concentration of the solid component exceeds the saturation solubility, as shown in FIG. 6B, the solid component is deposited at the solid-liquid interface (the boundary surface between the solid phase and the liquid phase) between the opening portion 1a and the ink composition 22, which is energetically most stable, so that the formation of the functional layer 24 starts.

Figure 6C:
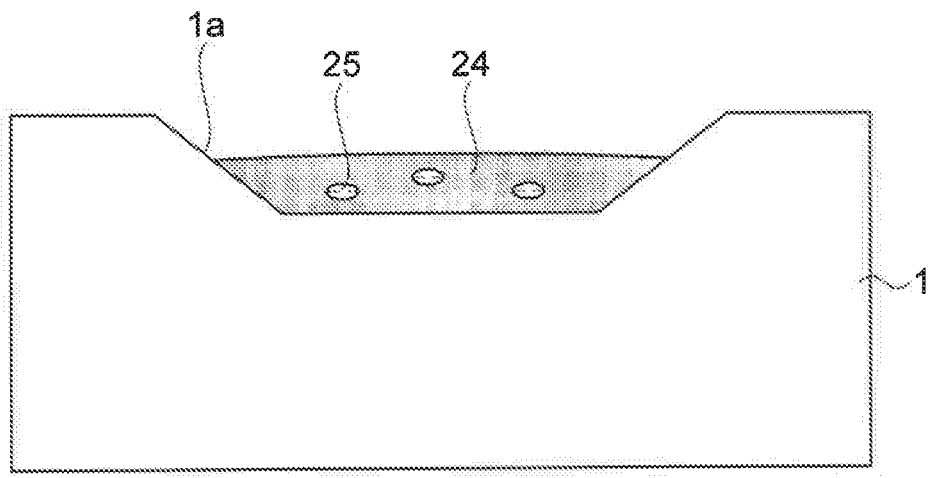
FIG. 6C is a schematic view showing a film formation behavior of an ink composition in the related art.

Thereafter, as shown in FIG. 6C, when the evaporation of the solvent proceeds, the functional layer 24 is formed. Since the functional layer 24 is formed slowly as compared with the functional layer 14, the uniformity of the film thickness is high, and a flat film is formed. At this time, a residual solvent 25 is present in the functional layer 24.

Figure 6D:
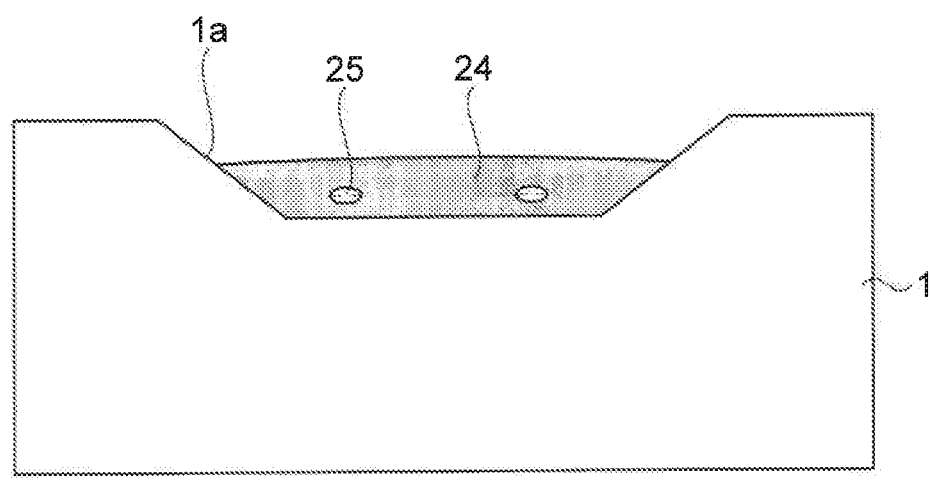
FIG. 6D is a schematic view showing a film formation behavior of an ink composition in the related art.

Subsequently, the residual solvent 25 is tried to be reduced by vacuum drying or the like. However, since the drying of the solvent is slow (the normal boiling point is high), as shown in FIG. 6D, it is difficult to reduce the residual solvent 25. Therefore, in the functional layer 24, the properties are likely to be deteriorated due to the effect of the residual solvent 25.

Film Formation Behavior of Ink Composition of this Embodiment

Figure 7:
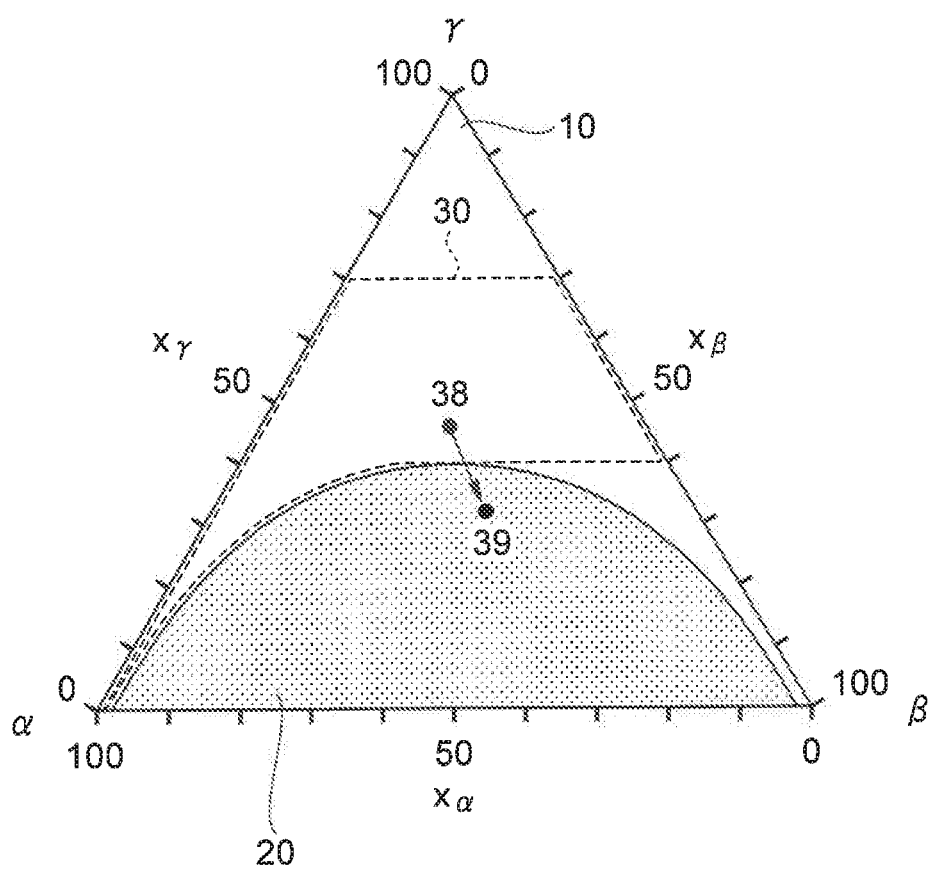
FIG. 7 is a triangular phase diagram for a first component, a second component, and a third component.

Next, a film formation behavior of the ink composition of this embodiment will be described with reference to FIGS. 7, 8A, 8B, 8C, 8D, and 8E. FIG. 7 is a triangular phase diagram for the first component, the second component, and the third component. FIGS. 8A to 8E are schematic views showing a film formation behavior of the ink composition.

The triangular phase diagram (ternary phase diagram) shown in FIG. 7 shows a state of a three-component mixing system of the first component (hydrophilic solvent) α, the second component (hydrophobic solvent) β, and the third component (amphiphilic solvent) γ at 25° C. The triangular phase diagram has three vertices α, β, and γ of an equilateral triangle corresponding to the above three components. In the mixing system of the above three components, a side α-β represents the content $X_\alpha$ (unit: mass %) of the first component, a side β-γ represents the content $X_\beta$ (unit: mass %) of the second component, and a side γ-α represents the content $X_\gamma$ (unit: mass %) of the third component. That is, the respective contents of $X_{\alpha A}$, $X_{\beta A}$, and $X_{\gamma A}$ of the above three components at an arbitrary point A (not shown) in the triangular phase diagram can be determined as follows. With respect to the content $X_{\alpha A}$, a point at which a straight line which passes through the point A and is parallel to the side β-γ intersects the side α-β is read. With respect to the content $X_{\beta A}$, a point at which a straight line which passes through the point A and is parallel to the side γ-α intersects the side β-γ is read. With respect to the content $X_{\gamma A}$, a point at which a straight line which passes through the point A and is parallel to the side α-β intersects the side γ-α is read.

The triangular phase diagram shown in FIG. 7 has a region 20 with a substantially semicircular shape with the side α-β taken as an approximate diameter, and a region 10 other than the region 20. The region 10 indicates a region in which the mixture of the above three components is composed of one phase without being separated, and the region 20 indicates a region in which the mixture of the above three components is separated into two phases. Further, in the region 10, a region 30 is included. The region 30 is a region which indicates the range of the content of each of the hydrophilic solvent (first component), the hydrophobic solvent (second component), and the amphiphilic solvent (third component) in the ink composition of this embodiment. The content of each of the above three components indicated in the region 30 is a content with respect to the total amount (total mass) of the above three components (not a content with respect to the total mass of the ink composition). Hereinafter, the content with respect to the total amount of the above three components in the ink composition 2 is referred to as "constituent ratio".

Figure 8A:
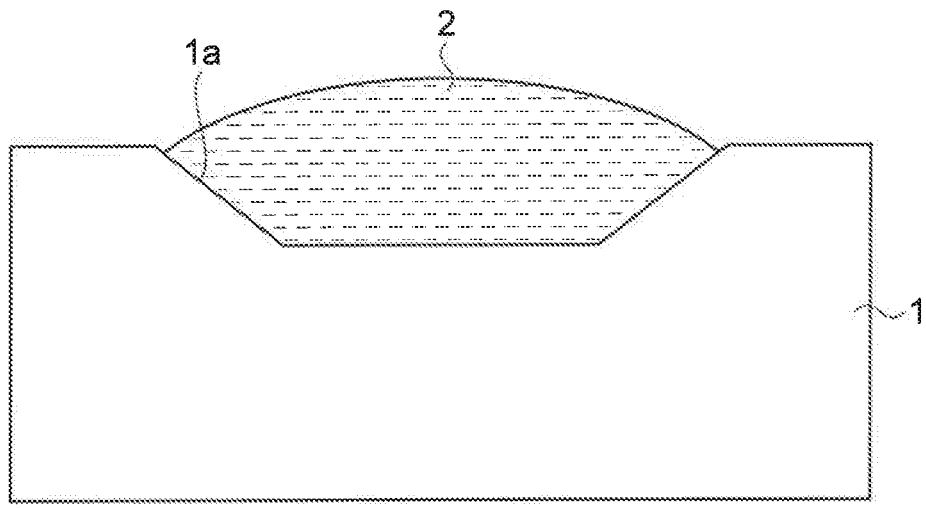
FIG. 8A is a schematic view showing a film formation behavior of an ink composition.

As shown in FIG. 8A, to an opening portion 1a of a base material 1, the ink composition 2 including the same solid component in the same amount as the ink composition 12 is applied. The solid component is assumed to be dissolved or dispersed in the ink composition 2. Here, as shown in the triangular phase diagram of FIG. 7, the initial constituent ratio of the ink composition 2 is assumed to reside at a point 38. That is, the point 38 is in the region 30, and therefore, the ink composition 2 immediately after application is composed of one phase without being separated.

Subsequently, the drying of the ink composition 2 (ink droplet) starts. Here, when the vapor pressure of the hydrophilic solvent (first component) is represented by $p_\alpha$, the vapor pressure of the hydrophobic solvent (second component) is represented by $p_\beta$, and the vapor pressure of the amphiphilic solvent (third component) is represented by $p_\gamma$, according to the relationship of the normal boiling points, the following relational formula is established: $p_\gamma > p_\alpha > p_\beta$. That is, as for the evaporation speed, the amphiphilic solvent (third component) evaporates the fastest, the hydrophilic solvent (first component) evaporates the second fastest, and the hydrophobic solvent (second component) evaporates the slowest. Therefore, at this time, the evaporation of the amphiphilic solvent (third component) mainly proceeds.

Figure 8B:
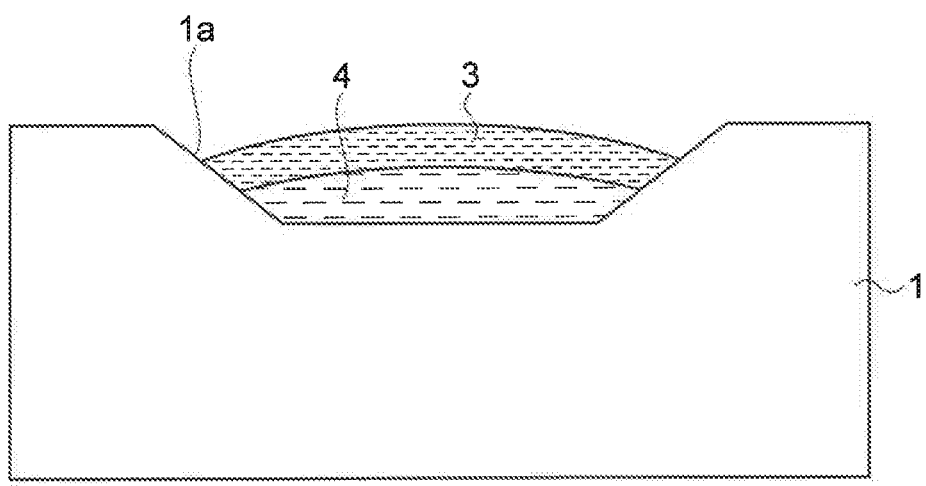
FIG. 8B is a schematic view showing a film formation behavior of an ink composition.

As the evaporation of the amphiphilic solvent (third component) proceeds, the constituent ratio shifts from the point 38 in the region 10 to a point 39 in the region 20 in FIG. 7. That is, as shown in FIG. 8B, when the amphiphilic solvent (third component) is reduced by evaporation, the compatibility between the hydrophilic solvent (first component) and the hydrophobic solvent (second component) is decreased, and the ink composition 2 changes (is separated) into the following two phases: a phase 4 mainly including the hydrophilic solvent (first component) and a phase 3 mainly including the hydrophobic solvent (second component). In this embodiment, the specific gravity of the hydrophilic solvent (first component) is larger than the specific gravity of the hydrophobic solvent (second component), and therefore, in the opening portion 1a, the lower layer becomes the phase 4, and the upper layer on the side coming into contact with a gas phase becomes the phase 3. As described above, the fourth component (solid component) has solubility or dispersibility in the hydrophilic solvent (first component), and therefore is mainly included in the phase 4. That is, the phase 4 mainly including the fourth component and the hydrophilic solvent (first component) having a low boiling point (a high vapor pressure) is in a state of being covered with the phase 3 mainly including the hydrophobic solvent (second component) having a high boiling point (a low vapor pressure) against the gas phase.

Figure 8C:
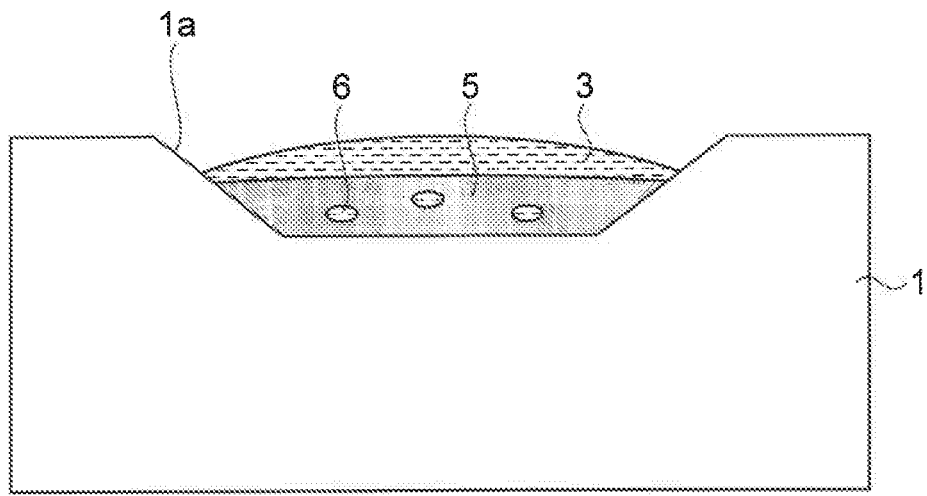
FIG. 8C is a schematic view showing a film formation behavior of an ink composition.

The vapor pressure pa is larger than the vapor pressure $p_\beta$, however, the amount of the hydrophilic solvent (first component) included in the phase 3 on the gas phase side is small, and the phase 4 is in a state of being covered with the phase 3, and therefore, the evaporation speed of the hydrophilic solvent (first component) becomes slower. When the hydrophilic solvent (first component) evaporates from the surface of the phase 3 and the hydrophilic solvent (first component) included in the phase 3 is reduced, the hydrophilic solvent (first component) and a small amount of the hydrophobic solvent (second component) and the amphiphilic solvent (third component) move from the phase 4 to the phase 3 so that the chemical potentials of the phase 3 and the phase 4 are equal to each other. These are repeated, and the hydrophilic solvent (first component) is gradually reduced. According to this, the concentration of the solid component in the phase 4 is relatively increased, and as shown in FIG. 8C, the solid component is deposited and the formation of the functional layer 5 starts.

Figure 8D:
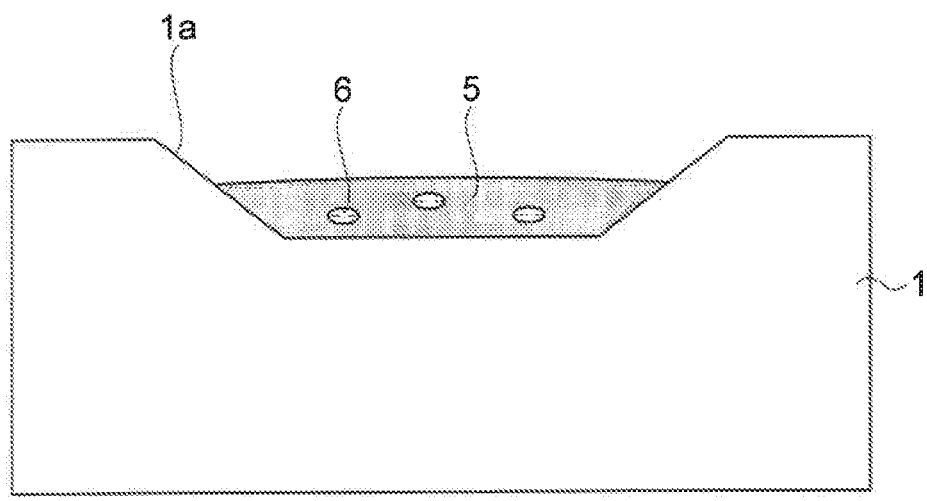
FIG. 8D is a schematic view showing a film formation behavior of an ink composition.

As described above, the phase 3 covers the phase 4 on the gas phase side, and therefore, in the drying of the ink composition 2, the evaporation speed of the hydrophobic solvent (second component) mainly included in the phase 3 is dominant. According to this, the drying of the ink composition 2 becomes slower, and the functional layer 5 is gradually formed. Then, as shown in FIG. 8D, when the hydrophobic solvent (second component) and most of the hydrophilic solvent (first component) evaporate, the functional layer 5 is formed. In the functional layer 5, the uniformity of the film thickness is high and a flat film is formed similarly to the functional layer 24 (see FIG. 6C). At this time, a residual solvent 6 derived from the phase 4 is present inside the functional layer 5. Since the main solvent component of the phase 4 is the hydrophilic solvent (first component), most of the residual solvent 6 is also the hydrophilic solvent (first component).

Figure 8E:
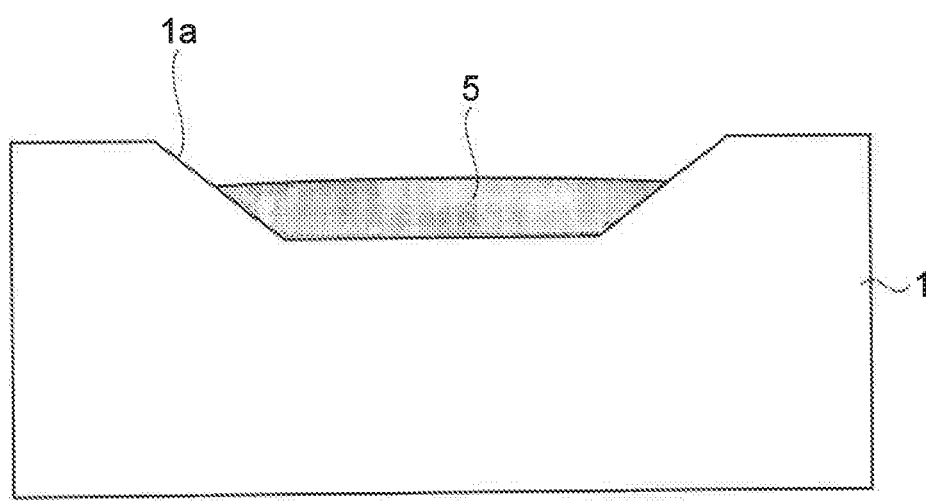
FIG. 8E is a schematic view showing a film formation behavior of an ink composition.

Subsequently, the residual solvent 6 is reduced by vacuum drying or the like. In the residual solvent 6, the hydrophobic solvent (second component) having a high normal boiling point (a low vapor pressure) is hardly included, and therefore, the residual solvent 6 can be easily reduced. According to this, as shown in FIG. 8E, the functional layer 5 in which the uniformity of the film thickness is high and the residual solvent is reduced can be obtained.

The film formation behavior of the ink composition of this embodiment has been described using the triangular phase diagram at 25° C. (FIG. 7), however, the temperature at the time of film formation is not limited to 25° C. Also at a temperature other than 25° C., the functional layer or the like can be formed by utilizing the phase change (from one phase to two phases) of the ink composition.

As described above, with the use of the ink composition, the method for producing an organic EL element, and the organic EL device according to this embodiment, the following effects can be obtained.

According to this embodiment, the uniformity of the ink components during storage or the like can be ensured, and also the uniformity of the film thickness in the functional layer 136 of the organic EL element 130 formed using the ink composition can be improved. More specifically, by including the third component (amphiphilic solvent), the compatibility between the first component (hydrophilic solvent) and the second component (hydrophobic solvent) is improved, and as compared with an ink in the related art, non-uniformity such as separation of the ink composition over time becomes less likely to occur. Further, since both of the hydrophilic solvent (first component) and the hydrophobic solvent (second component) are used, the solubility or dispersibility of a functional layer forming material or the like is ensured, and the uniformity of the functional layer forming material or the like in the ink composition is improved. According to this, in the inside or the like of the storage container or the liquid droplet ejection device, separation or the like of the ink components of the ink composition over time is suppressed, and the composition can be maintained. In addition, a variation in the components of the ink composition is less likely to occur, and therefore, the drying property of the ink droplet (the liquid droplet of the ink composition) becomes stable. Due to this, when the functional layer 136 of the organic EL element 130 is formed using the ink composition of this embodiment, the organic EL element 130, that is, the organic EL device 100 having desired properties can be produced.

In addition, the drying property of the ink composition is controlled by a phase change so as to improve the flatness of the functional layer 136, and thus, the uniformity of the film thickness can be further improved. More specifically, by the evaporation of the amphiphilic solvent (third component), the compatibility between the hydrophilic solvent (first component) and the hydrophobic solvent (second component) is decreased, and the ink composition is separated into the following two phases; a phase 3 and a phase 4. At this time, the phase 4 mainly includes the hydrophilic solvent (first component), and the phase 3 mainly includes the hydrophobic solvent (second component) which has a smaller specific gravity than the hydrophilic solvent (first component) and has a higher normal boiling point than the hydrophilic solvent (first component). Further, the solid component (fourth component) including the functional layer forming material is dissolved or dispersed in the phase 3. Due to this, the phase 4 is in a state of being covered with the phase 3 on the gas phase side. According to this, the drying of the ink composition proceeds slowly so as to improve the uniformity of the film thickness, and thus, the functional layer 136, which is flat and in which a variation in the film thickness occurs less, is obtained. Further, most of the hydrophobic solvent (second component) is included in the phase 3 on the gas phase side, and therefore, the hydrophobic solvent (second component) is less likely to remain as the residual solvent 6 in the formed functional layer 136. That is, the main component of the residual solvent 6 in the functional layer 136 is the hydrophilic solvent (first component) having a low normal boiling point, and therefore can be easily reduced by vacuum drying or the like. According to this, the residual solvent 6 in the functional layer 136 is reduced, and therefore, the properties of the organic EL element 130 can be improved.

Accordingly, an ink composition including a functional layer forming material capable of improving the uniformity of the film thickness of the functional layer 136 to be formed, and reducing the residual solvent in the film can be provided. Further, a method for producing the organic EL element 130 capable of improving the properties such as driving voltage, luminous efficiency, and emission lifetime using this ink composition can be provided. Moreover, the organic EL device 100 having properties improved by the organic EL element 130, and also having long lifetime and high efficiency can be provided.

Hereinafter, with respect to the ink composition of this embodiment, the effects of this embodiment will be more specifically described by showing Examples and Comparative Examples.

Phase Separation Property

First, a favorable combination of the first component, the second component, and the third component to be used in the ink composition of this embodiment will be described with reference to FIGS. 9, 10, and 11. FIGS. 9, 10, and 11 are charts showing a phase separation property according to Examples of the first embodiment. Here, with respect to the phase separation property, a test as to whether or not the criteria for determination of the following conditions are satisfied was performed: a condition in which a mixture obtained by mixing the first component (hydrophilic solvent) and the second component (hydrophobic solvent) at the same mass is separated into two phases; and a condition in which the mixture changes into one phase by mixing the third component (amphiphilic solvent) in the mixture at the same mass as that of the mixture.

In FIGS. 9, 10, and 11, with respect to the combination of the first component (hydrophilic solvent) and the second component (hydrophobic solvent), as the third component (amphiphilic solvent), 1-alkyl alcohol (normal alcohol) and 2-alkanone (methyl alkyl ketone) were used. As for 1-alkyl alcohol, the above test was performed by changing the type of 1-alkyl alcohol among compounds having 4 or more and 7 or less carbon atoms, and a case where not less than half of the combinations satisfied the criteria for determination described above was evaluated as "A (suitable)", a case where less than half of the combinations for one or more types satisfied the criteria for determination was evaluated as "B (moderate)", and a case where the combinations for all compounds did not satisfy the criteria for determination was evaluated as "C (unsuitable)", and the evaluation results are entered in the column of "Phase separation property". As for 2-alkanone, a test was performed in the same manner as in the case of I-alkyl alcohol described above by changing the type of 2-alkanone among compounds having 6 or more and 12 or less carbon atoms, and the evaluation results are entered in the column of "Phase separation property".

In the ink composition of this embodiment, it is preferred to apply the combinations for which the test results shown in FIGS. 9, 10, and 11 were "A (suitable)". In particular, it is more preferred to use triethylene glycol monomethyl ether or triethylene glycol monobutyl ether as the first component (hydrophilic solvent). By using triethylene glycol monomethyl ether or triethylene glycol monobutyl ether, a favorable phase separation property can be exhibited. This is attributed to the fact that an attractive force (intermolecular force) based on a hydrogen bond which acts on between molecules is larger than the other first components (hydrophilic solvents) as presumed from the magnitude of the specific gravity of triethylene glycol monomethyl ether or triethylene glycol monobutyl ether. By this intermolecular force, stronger affinity acts on between a polar portion of the third component (amphiphilic solvent) and a polar portion of the first component (hydrophilic solvent), and the compatibility with the third component (amphiphilic solvent) can be further enhanced. In addition, in triethylene glycol monomethyl ether or triethylene glycol monobutyl ether, as compared with, for example, ethylene glycol, diethylene glycol, or the like, a non-polar portion which exhibits hydrophobicity is long, and therefore, the compatibility with the second component (hydrophobic solvent) is sufficiently ensured. In the actual ink composition, the fourth component having solubility or dispersibility in the hydrophilic solvent (first component) is additionally added. When the content of the fourth component with respect to the total amount of the ink composition is set to 5 mass % or less, the type of the fourth component does not affect the phase separation property or the ejection stability from the inkjet head 50 (see FIG. 4).

Example 1

Ink Composition Including Hole Injection Layer Material

As an ink composition of Example 1, an ink composition including a hole injection layer material (HIL material) will be described. The ink composition of Example 1 was prepared by selecting the first component: diethylene glycol monoisobutyl ether (normal boiling point: about 220° C., specific gravity: about 0.95 g/cm$^3$) (45.5 mass %), the second component: dodecylbenzene (normal boiling point: about 264° C., specific gravity: about 0.86 g/cm$^3$) (45.5 mass %), and the third component: 1-pentanol (normal boiling point: about 138° C.) (9 mass %) from the combinations shown in FIG. 11, and stirring and mixing the components, and then further dispersing the fourth component (HIL material): PEDOT/PSS (2 mass %) therein. Here, PEDOT/PSS as the HIL material has dispersibility in the hydrophilic solvent (first component).

Production of Organic EL Element

To the opening portion 106a of the element substrate 101 described above, the ink composition of Example 1 was applied using an inkjet method. Subsequently, vacuum drying was performed, and then, a heating treatment was performed in an atmospheric pressure at 150° C. for 30 minutes, whereby a hole injection layer 131 (see FIG. 2) was formed. Here, with respect to the hole injection layer 131, the uniformity of the film thickness was evaluated. The evaluation of the uniformity of the film thickness will be described later. Subsequently, a cyclohexylbenzene solution including TFB as an HTL material at 0.25 mass % was applied to the upper surface of the hole injection layer 131 using an inkjet method. Then, after vacuum drying was performed, heating was performed in a nitrogen gas atmosphere at 180° C. for 1 hour. Subsequently, in order to remove the soluble component of TFB, washing was performed using xylene, whereby a hole transport layer 132 (see FIG. 2) having a film thickness of about 20 nm was formed. Thereafter, a 2-methylbenzofuran solution including a red light-emitting material at 2 mass % was applied to the upper surface of the hole transport layer 132 using an inkjet method. Subsequently, after vacuum drying was performed, heating was performed in a nitrogen gas atmosphere at 160° C. for 10 minutes, whereby a light-emitting layer 133 (see FIG. 2) having a film thickness of about 60 nm to 80 nm was formed. Then, an electron transport layer 134 (see FIG. 2) and an electron injection layer 135 (see FIG. 2) were stacked thereon by a vacuum deposition method under the conditions that the vacuum degree was about 10$^{-6}$ Torr (about 1.33×10$^{-4}$ Pa), whereby an organic EL element (see FIG. 2) of Example 1 was produced.

Observation of State of Phase of Ink Composition

Here, an ink composition 1b in which the content of the third component (amphiphilic solvent) was changed with respect to the ink composition of Example 1 was prepared, and the state of the phase thereof was observed along with the ink composition of Example 1.

First, the ink composition 1b was prepared in the same manner as in Example 1 except that the content of 1-pentanol as the third component was changed to 5 mass % with respect to the ink composition of Example 1.

Subsequently, each of the ink composition of Example 1 and the ink composition 1b was placed in a glass tube bottle, and the external appearance was observed. As a result, in the ink composition of Example 1, separation or the like was not observed, and one phase was formed. On the other hand, in the ink composition 1b, separation was observed, and two phases were formed. In the two phases, the lower layer (lower phase) was colored black. That is, the lower layer is a phase, in which diethylene glycol monoisobutyl ether as the first component (hydrophilic solvent) is mainly included, and the HIL material is dispersed. Therefore, it was shown that an ink composition which is composed of one phase at the initial stage at which the solvent does not evaporate like the ink composition of Example 1 is easily separated into two phases by evaporation of the third component. According to this, the upper layer becomes a phase mainly composed of the second component (dodecylbenzene) having a higher normal boiling point than the first component. Therefore, by covering the lower layer on the gas phase side with the upper layer, evaporation of diethylene glycol monoisobutyl ether from the lower layer in which the HIL material is dispersed is suppressed, and the deposition of the HIL material (the formation of the hole injection layer) can be made to proceed slowly.

Evaluation of Uniformity of Film Thickness

Figures 12, 13:
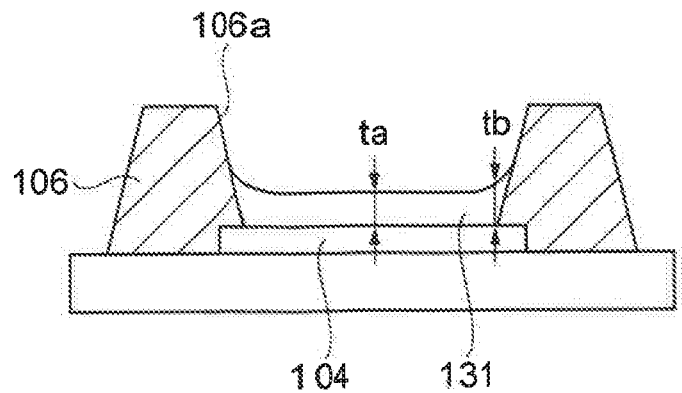
FIG. 12 is a schematic view showing a film thickness profile of a hole injection layer.
FIG. 13 is a chart showing the evaluation results of Examples and Comparative Examples.

The evaluation of the uniformity of the film thickness in the hole injection layer 131 will be described with reference to FIG. 12. FIG. 12 is a schematic view showing a film thickness profile of a hole injection layer.

With respect to the hole injection layer 131 of Example 1, the uniformity of the film thickness was evaluated. By using a probe-type measurement device, the film thickness profile of each hole injection layer 131 was measured. As shown in FIG. 12, in the hole injection layer 131 in which the opening portion 106a was formed, a film thickness in a central portion of a pixel electrode 104 is defined as a central film thickness ta, and a film thickness in an edge portion in contact with the pixel electrode 104 is defined as an edge film thickness tb. From the above film thickness profile, the central film thickness ta and the edge film thickness tb were determined, and the ratio ta/tb was calculated. In the evaluation of the uniformity of the film thickness, a case where the ratio ta/tb was 0.75 or more and less than 1.5 was evaluated as "S (superior)", a case where the ratio ta/tb was 0.5 or more and less than 0.75, or 1.5 or more and less than 2 was evaluated as "A (suitable)", a case where the ratio ta/tb was 0.1 or more and less than 0.5, or 2 or more and less than 10 was evaluated as "B (somewhat unsuitable)", and a case where the ratio ta/tb was less than 0.1 or 10 or more was evaluated as "C (unsuitable)". The evaluation results are shown in FIG. 13.

Evaluation of Properties of Organic EL Element

Figures 14, 15:
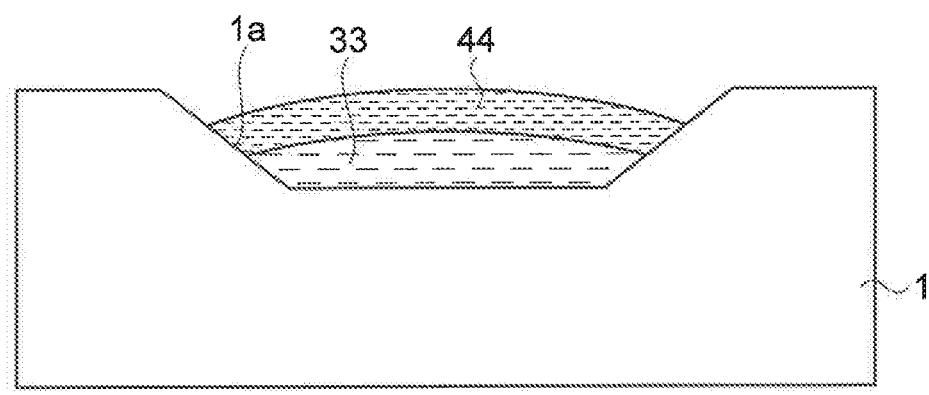
FIG. 14 is a chart showing the evaluation results of Examples and Comparative Examples.
FIG. 15 is a schematic view showing a film formation behavior of an ink composition according to a second embodiment.

Subsequently, with respect to the properties of the organic EL element 130 of Example 1, the driving voltage, current efficiency, and half lifetime were evaluated. The driving voltage is a DC voltage value at which the emission brightness of the organic EL element 130 becomes a predetermined value, and a smaller driving voltage is preferred. The current efficiency (luminous efficiency) is a value obtained by dividing the emission brightness by the value of a current flowing when the emission brightness of the organic EL element 130 is set to a predetermined value, and the unit thereof is cd/A (candela per ampere). A higher current efficiency is preferred. The half lifetime is an energization time (unit: h) until the emission brightness of the organic EL element 130 is halved from the predetermined value, and a longer half lifetime is preferred. The predetermined emission brightness is, for example, 1000 cd/m² (candela per square meter). With respect to the determined driving voltage, current efficiency, and half lifetime, the value of the below-mentioned Comparative Example 2 was taken as 1.0, and the relative values with respect to this value are shown in FIG. 14.

Example 2

In Example 2, an ink composition of Example 2 was prepared in the same manner as in Example 1 except that the ink composition including the HIL material was changed with respect to Example 1, and an organic EL element was formed.

The ink composition of Example 2 was prepared by selecting the first component: diethylene glycol monoisobutyl ether (normal boiling point: about 220° C., specific gravity: about 0.95 g/cm³) (42 mass %), the second component: dodecylbenzene (normal boiling point: about 264° C., specific gravity: about 0.86 g/cm³) (42 mass %), and the third component: 1-pentanol (normal boiling point: about 138° C.) (14 mass %), and then further dissolving the fourth component (HIL material): a high-molecular compound described in Example 1 in Patent Document WO 2007/043607 (A1) (2 mass %) therein. Here, the high-molecular compound as the fourth component has solubility in the hydrophilic solvent (first component). In Example 2, in the same manner as in Example 1, the evaluation of the uniformity of the film thickness in the hole injection layer, and the evaluation of the driving voltage, current efficiency, and half lifetime were performed, and the results are shown in FIGS. 13 and 14.

Comparative Example 1

In Comparative Example 1, an ink composition of Comparative Example 1 was prepared in the same manner as in Example 1 except that the ink composition including the HIL material was changed with respect to Example 1, and an organic EL element was formed.

In Comparative Example 1, the ink composition was prepared by dispersing PEDOT/PSS (2 mass %) as the HIL material in diethylene glycol monoisobutyl ether (normal boiling point: about 220° C.). Here, the solution including the HIL material of Comparative Example 1 is at a level where the total amount of the second component (dodecylbenzene) and the third component (1-pentanol) in the ink composition including the HIL material of Example 1 was replaced with diethylene glycol monoisobutyl ether. In Comparative Example 1, in the same manner as in Example 1, the evaluation of the uniformity of the film thickness in the hole injection layer was performed, and the result is shown in FIG. 13.

Comparative Example 2

In Comparative Example 2, an ink composition of Comparative Example 2 was prepared in the same manner as in Example 1 except that the ink composition including the HIL material was changed with respect to Example 1, and an organic EL element was formed.

In Comparative Example 2, the ink composition was prepared by dispersing PEDOT/PSS (2 mass %) as the HIL material in triethylene glycol monobutyl ether (normal boiling point: about 271° C.). Here, the solution including the HIL material of Comparative Example 2 is at a level where a hydrophilic solvent (triethylene glycol monobutyl ether) having a high normal boiling point was used with respect to the ink composition including the HIL material of Example 1. In Comparative Example 2, in the same manner as in Example 1, the evaluation of the driving voltage, current efficiency, and half lifetime was performed, and the results are shown in FIG. 14.

Comparative Example 3

In Comparative Example 3, an ink composition of Comparative Example 3 was prepared in the same manner as in Example 1 except that the ink composition including the HIL material was changed with respect to Example 1, and an organic EL element was formed.

In Comparative Example 3, the ink composition was prepared by dissolving a high-molecular compound described in Example 1 in Patent Document WO 2007/043607 (A1) (2 mass %) as the HIL material in diethylene glycol monoisobutyl ether (normal boiling point: about 220° C.). The solution including the HIL material of Comparative Example 3 is at a level where the total amount of the second component (dodecylbenzene) and the third component (1-pentanol) in the ink composition including the HIL material of Example 2 was replaced with diethylene glycol monoisobutyl ether. In Comparative Example 3, in the same manner as in Example 1, the evaluation of the uniformity of the film thickness in the hole injection layer was performed, and the result is shown in FIG. 13.

Comparative Example 4

In Comparative Example 4, an ink composition of Comparative Example 4 was prepared in the same manner as in Example 1 except that the ink composition including the HIL material was changed with respect to Example 1, and an organic EL element was formed.

In Comparative Example 4, the ink composition was prepared by dissolving a high-molecular compound described in Example 1 in Patent Document WO 2007/043607 (A1) (2 mass %) as the HIL material in triethylene glycol monobutyl ether (normal boiling point: about 271° C.). Here, the solution including the HIL material of Comparative Example 4 is at a level where a hydrophilic solvent (triethylene glycol monobutyl ether) having a high normal boiling point was used with respect to the ink composition including the HIL material of Example 2. In Comparative Example 4, in the same manner as in Example 1, the evaluation of the driving voltage, current efficiency, and half lifetime was performed, and the results are shown in FIG. 14.

Evaluation Results

Uniformity of Film Thickness

The uniformity of the film thickness in the hole injection layer and the properties of the organic EL element will be described with reference to FIGS. 13 and 14. FIGS. 13 and 14 are charts showing the evaluation results of Examples and Comparative Examples.

As shown in FIG. 13, with respect to the uniformity of the film thickness in the hole injection layer, Examples 1 and 2 are superior to Comparative Examples 1 and 3. As described above, the ink compositions including the HIL material of Examples 1 and 2 are different from those of Comparative Examples 1 and 3 in that the hydrophobic solvent (second component) and the amphiphilic solvent (third component) are included. That is, the reason why Examples 1 and 2 are superior is presumed to be because the phase including the HIL material was covered, and the evaporation of the hydrophilic solvent (first component) proceeded slowly.

Further, the HIL material of Example 1 has dispersibility in the hydrophilic solvent (first component), and the HIL material of Example 2 has solubility in the hydrophilic solvent (first component). Therefore, in this embodiment, it was also shown that if the HIL material has either dispersibility or solubility in the hydrophilic solvent (first component), the uniformity of the film thickness is improved.

Properties of Organic EL Element

As shown in FIG. 14, with respect to the properties of the organic EL element, Examples 1 and 2 are superior to Comparative Examples 2 and 4. In order to perform a more detailed examination, a comparison was performed between those including the same HIL material, that is, between Example 1 and Comparative Example 2, and between Example 2 and Comparative Example 4.

In Example 1, as compared with Comparative Example 2, the driving voltage is lower, the current efficiency is higher, and the half lifetime is longer, and therefore, it was shown that with respect to all properties, Example 1 is superior to Comparative Example 2. This is considered to be because in the ink composition of Comparative Example 2, triethylene glycol monobutyl ether (normal boiling point: about 271° C.) having a high normal boiling point is used, however, in Example 1, diethylene glycol monoisobutyl ether (normal boiling point: about 220° C.) is used.

In general, energy and time required for eliminating a solvent remaining inside an amorphous material are affected by the normal boiling point of the residual solvent. That is, it can be said that as the normal boiling point of the solvent is higher, it is difficult to eliminate the solvent. Further, when the solvent remains in the hole injection layer, the solvent impedes the charge transport in the hole injection layer as a charge trap, or electrical energy is continuously converted to thermal energy at a trap level, which becomes a factor to accelerate the deterioration of the organic EL element. Due to this, it is presumed that in Example 1, the amount of the hydrophilic solvent (first component) remaining in the hole injection layer was reduced as compared with Comparative Example 2, and thus, the above-mentioned properties were improved.

In Example 2, as compared with Comparative Example 4, the driving voltage is lower, the current efficiency is higher, and the half lifetime is longer, and therefore, it was shown that with respect to all properties, Example 2 is superior to Comparative Example 4. This is considered to be because the amount of the solvent remaining in the hole injection layer was reduced as compared with Comparative Example 4 in which triethylene glycol monobutyl ether was used as the hydrophilic solvent (first component) similar to the relationship between Example 1 and Comparative Example 2 described above.

Second Embodiment

An ink composition according to this embodiment will be described by showing an ink composition including a functional layer forming material for forming an organic semiconductor layer (functional layer) of an organic EL element by an inkjet method in the same manner as in the first embodiment. Incidentally, the same reference numerals are used to refer to the same constituent portions as those of the first embodiment, and the repeated description thereof will be omitted.

Ink Composition Including Functional Layer Forming Material

The ink composition according to this embodiment includes a first component which is a hydrophilic solvent, a second component which is a hydrophobic solvent, a third component which is an amphiphilic solvent, and a fourth component which includes a solute or a dispersing element, and changes from one phase to two phases when the third component evaporates in the same manner as in the first embodiment. Further, the normal boiling point of the third component is set lower than the normal boiling point of the first component and the normal boiling point of the second component. Here, the normal boiling point of the first component is higher than the normal boiling point of the second component, and the specific gravity of the first component is smaller than the specific gravity of the second component, which are different from the first embodiment. That is, in the ink composition of this embodiment, the relationship of the normal boiling point and the specific gravity between the first component and the second component was made opposite to that of the first embodiment.

The ink composition of this embodiment can be used as at least one type of the ink 150 (including a hole injection layer material), the ink 160 (including a hole transport layer material), and the ink 170 (including a light-emitting layer material) in the same manner as in the first embodiment.

In the ink composition of this embodiment, the same hole injection transport layer material or the same light-emitting layer material as the fourth component, the same hydrophilic solvent as the first component, the same hydrophobic solvent as the second component, and the same amphiphilic solvent as the third component as those in the first embodiment can be used. As the fourth component (the solute or the dispersing element), it is preferred to use a material which can be dissolved or dispersed (has solubility or dispersibility) in the second component (hydrophobic solvent). According to this, in an ink droplet formed by the ink composition, when the third component evaporates and the compatibility between the first component and the second component is decreased, the ink droplet changes from one phase to two phases. At this time, the specific gravity of the first component is smaller than the specific gravity of the second component, and therefore, two phases in which the second component and the fourth component are included in the lower layer and the first component is included in the upper layer can be formed.

By using the ink composition of this embodiment, an organic EL element can be produced in the same manner as in the first embodiment. Further, the produced organic EL element can be mounted on an organic EL device in the same manner as in the first embodiment.

Film Formation Behavior of Ink Composition

A film formation behavior of the ink composition of this embodiment will be described with reference to FIG. 15. FIG. 15 is a schematic view showing a film formation behavior of the ink composition according to the second embodiment. FIG. 15 shows a stage corresponding to FIG. 8B in the film formation behavior of the first embodiment.

A solid component such as a functional layer forming material included in the ink composition of this embodiment has solubility or dispersibility in the second component (hydrophobic solvent). Therefore, the fourth component is dissolved or dispersed also in the ink composition. Further, by the third component, the compatibility between the first component and the second component is improved, and thus, the ink composition is composed of one phase.

When the drying of the ink composition starts after the ink composition is applied to the opening portion 1a of the base material 1, the evaporation of the third component (amphiphilic solvent) proceeds prior to the first component (hydrophilic solvent) and the second component (hydrophobic solvent). Subsequently, when the amphiphilic solvent (third component) is reduced by evaporation, the compatibility between the hydrophilic solvent (first component) and the hydrophobic solvent (second component) is decreased. Due to this, as shown in FIG. 15, the ink composition changes (is separated) into the following two phases: a phase 33 mainly including the hydrophobic solvent (second component) and a phase 44 mainly including the hydrophilic solvent (first component). In this embodiment, the specific gravity of the hydrophilic solvent (first component) is smaller than the specific gravity of the hydrophobic solvent (second component), and therefore, in the opening portion 1a, the lower layer becomes the phase 33, and the upper layer coming into contact with a gas phase becomes the phase 44. As described above, the fourth component (solid component) has solubility or dispersibility in the hydrophobic solvent (second component), and therefore is mainly included in the phase 33. That is, the phase 33 mainly including the fourth component and the hydrophobic solvent (second component) having a low boiling point (a high vapor pressure) is in a state of being covered with the phase 44 mainly including the hydrophilic solvent (first component) having a high boiling point (a low vapor pressure) against the gas phase.

The hydrophobic solvent (second component) has a lower normal boiling point than the hydrophilic solvent (first component), however, the amount of the hydrophobic solvent (second component) included in the phase 44 on the gas phase side is small, and the phase 33 is in a state of being covered with the phase 44, and therefore, the evaporation speed of the hydrophobic solvent (second component) becomes slower. When the hydrophilic solvent (first component) evaporates from the surface of the phase 44 and the hydrophobic solvent (second component) included in the phase 44 is reduced, the hydrophobic solvent (second component) and a small amount of the hydrophilic solvent (first component) and the amphiphilic solvent (third component) move from the phase 33 to the phase 44 so that the chemical potentials of the phase 44 and the phase 33 are equal to each other. These are repeated, and the hydrophobic solvent (second component) is gradually reduced. According to this, the concentration of the solid component in the phase 33 is relatively increased, and the solid component is deposited, so that the formation of the functional layer starts. Thereafter, in the same manner as in the first embodiment, the deposition of the solid component proceeds slowly, and the functional layer is formed.

In the formed functional layer, a residual solvent including the hydrophobic solvent (second component) as a main component is present, however, the hydrophilic solvent (first component) having a higher normal boiling point than the hydrophobic solvent (second component) is hardly included, and therefore, the residual solvent can be easily reduced by vacuum drying or the like. According to this, the functional layer in which the uniformity of the film thickness is high and the residual solvent is reduced can be obtained.

As described above, with the use of the ink composition, the method for producing an organic EL element, and the organic EL device according to this embodiment, the following effects can be obtained.

By using a forming material having solubility or dispersibility in the hydrophobic solvent (second component) as the functional layer forming material, the uniformity of the ink components during storage or the like can be ensured, and also the uniformity of the film thickness in the functional layer of the organic EL element formed using the ink composition can be improved.

In addition, the drying property of the ink composition is controlled by a phase change so as to improve the flatness of the functional layer, and thus, the uniformity of the film thickness can be further improved. More specifically, by the evaporation of the amphiphilic solvent (third component), the compatibility between the hydrophilic solvent (first component) and the hydrophobic solvent (second component) is decreased, and the ink composition is separated into the following two phases; a phase 44 and a phase 33. At this time, the phase 44 mainly includes the hydrophilic solvent (first component), and the phase 33 mainly includes the hydrophobic solvent (second component) which has a larger specific gravity than the hydrophilic solvent (first component) and has a lower normal boiling point than the hydrophilic solvent (first component). Further, the solid component (fourth component) including the functional layer forming material is dissolved or dispersed in the phase 33. Due to this, the phase 33 is in a state of being covered with the phase 44 on the gas phase side. According to this, the drying of the ink composition proceeds slowly so as to improve the uniformity of the film thickness, and thus, the functional layer, which is flat and in which a variation in the film thickness occurs less, is obtained. Further, most of the hydrophilic solvent (first component) is included in the phase 44 on the gas phase side, and therefore, the hydrophilic solvent (first component) is less likely to remain as the residual solvent in the formed functional layer. That is, the main component of the residual solvent in the functional layer is the hydrophobic solvent (second component) having a low normal boiling point, and therefore can be easily reduced by vacuum drying or the like. According to this, the residual solvent in the functional layer is reduced, and therefore, the properties of the organic EL element can be improved.

Accordingly, an ink composition including a functional layer forming material having solubility or dispersibility in the hydrophobic solvent (second component), and capable of improving the uniformity of the film thickness of the functional layer to be formed, and reducing the residual solvent in the film can be provided. Further, a method for producing an organic EL element capable of improving the properties such as driving voltage, luminous efficiency, and emission lifetime using this ink composition can be provided. Moreover, the organic EL device having properties improved by the organic EL element, and also having long lifetime and high efficiency can be provided.

Hereinafter, with respect to the ink composition of this embodiment, the effects of this embodiment will be more specifically described by showing Examples and Comparative Examples.

Phase Separation Property

First, a favorable combination of the first component, the second component, and the third component to be used in the ink composition of this embodiment will be described with reference to FIG. 16. FIG. 16 is a chart showing a phase separation property according to Examples of the second embodiment. Here, with respect to the phase separation property, in the same manner as in the first embodiment, a test as to whether or not the criteria for determination of the following conditions were satisfied was performed: a condition in which a mixture obtained by mixing the first component (hydrophilic solvent) and the second component (hydrophobic solvent) at the same mass is separated into two phases; and a condition in which the mixture changes into one phase by mixing the third component (amphiphilic solvent) in the mixture at the same mass as that of the mixture.

In FIG. 16, with respect to the combination of the first component (hydrophilic solvent) and the second component (hydrophobic solvent), in the same manner as in the first embodiment, as the third component (amphiphilic solvent), 1-alkyl alcohol (normal alcohol) and 2-alkanone (methyl alkyl ketone) were used. As for 1-alkyl alcohol, the above test was performed by changing the type of I-alkyl alcohol among compounds having 4 or more and 7 or less carbon atoms, and a case where not less than half of the combinations satisfied the criteria for determination described above was evaluated as "A (suitable)", a case where less than half of the combinations for one or more types satisfied the criteria for determination was evaluated as "B (moderate)", and a case where the combinations for all compounds did not satisfy the criteria for determination was evaluated as "C (unsuitable)", and the evaluation results are entered in the column of "Phase separation property". As for 2-alkanone, a test was performed in the same manner as in the case of I-alkyl alcohol described above by changing the type of 2-alkanone among compounds having 6 or more and 12 or less carbon atoms, and the evaluation results are entered in the column of "Phase separation property".

In the ink composition of this embodiment, it is preferred to apply the combinations for which the test results shown in FIG. 16 were "A (suitable)". In particular, it is more preferred to use 3-phenoxytoluene as the second component (hydrophobic solvent). By using 3-phenoxytoluene, a favorable phase separation property can be exhibited. This is because as compared with a benzofuran-based compound such as 2-methylbenzofuran having a planar structure, 3-phenoxytoluene has a bulky molecular structure, and has a high effect of preventing another molecule from coming close thereto, and therefore, the polarity is more significantly changed by the third component (amphiphilic solvent). In the actual ink composition, the fourth component having solubility or dispersibility in the second component (hydrophobic solvent) is additionally added. If the content of the fourth component with respect to the total amount of the ink composition is set to 5 mass % or less, the type of the fourth component does not affect the phase separation property or the ejection stability from the inkjet head 50 (see FIG. 4).

Example 3

Ink Composition Including Light-Emitting Layer Material

As an ink composition of Example 3, an ink composition including a light-emitting layer material (EML material) will be described. The ink composition of Example 3 was prepared by selecting the first component: 1,5-pentanediol (normal boiling point: about 239° C., specific gravity: about 0.99 g/cm$^3$) (46 mass %), the second component: 2-methylbenzofuran (normal boiling point: about 197° C., specific gravity: about 1.06 g/cm$^3$) (46 mass %), and the third component: 1-heptanol (normal boiling point: about 176° C.) (6 mass %) from the combinations shown in FIG. 16, and stirring and mixing the components, and then further dissolving the fourth component (EML material): a red light-emitting material (2 mass %) therein. Here, the red light-emitting material as the EML material has solubility in the hydrophobic solvent (second component).

Production of Organic EL Element

In Example 3, an organic EL element of Example 3 was produced in the same manner as in Example 1 except that the ink composition including the HIL material and the solution including the EML material were changed with respect to Example 1 of the first embodiment. More specifically, an HIL material solution in which PEDOT/PSS (2 mass %) as the HIL material was dispersed in diethylene glycol monoisobutyl ether was prepared and used in place of the ink composition including the HIL material of Example 1. Further, in place of the solution including the EML material of Example 1, the above-mentioned ink composition of Example 3 (the ink composition including the EML material) was used. After the light-emitting layer was formed, in the same manner as the hole injection layer 131 of Example 1, the evaluation of the uniformity of the film thickness in the light-emitting layer was performed. The other procedure was performed in the same manner as in Example 1, whereby the organic EL element of Example 3 was produced.

Observation of State of Phase of Ink Composition

Here, an ink composition 3*b* in which the content of the third component was changed with respect to the ink composition of Example 3 was prepared, and the state of the phase thereof was observed along with the ink composition of Example 3.

First, the ink composition 3*b* was prepared in the same manner as in Example 3 except that the content of 1-heptanol as the third component was changed to 1 mass % with respect to the ink composition of Example 3.

Subsequently, each of the ink composition of Example 3 and the ink composition 3*b* was placed in a glass tube bottle, and the external appearance was observed. As a result, in the ink composition of Example 3, separation or the like was not observed, and one phase was formed. On the other hand, in the ink composition 3*b*, separation was observed, and two phases were formed. In the two phases, the lower layer (lower phase) was colored red. That is, the lower layer is a phase, in which 2-methylbenzofuran as the second component (hydrophobic solvent) is mainly included, and the EML material is dissolved. Therefore, it was shown that an ink composition which is composed of one phase at the initial stage at which the solvent does not evaporate like the ink composition of Example 3 is easily separated into two phases by evaporation of the third component. According to this, the upper layer becomes a phase mainly composed of the first component (1,5-pentanediol) having a higher normal boiling point than the second component. Therefore, by covering the lower layer on the gas phase side with the upper layer, evaporation of 2-methylbenzofuran from the lower layer in which the EML material is dissolved is suppressed, and the deposition of the EML material (the formation of the light-emitting layer) can be made to proceed slowly.

Comparative Example 5

In Comparative Example 5, an ink composition of Comparative Example 5 was prepared in the same manner as in Example 3 except that the ink composition including the EML material was changed with respect to Example 3, and an organic EL element was formed.

In Comparative Example 5, the ink composition was prepared by dissolving the red light-emitting material (2 mass %) in 2-methylbenzofuran. Here, the solution including the EML material of Comparative Example 5 is at a level where the total amount of the first component (1,5-pentanediol) and the third component (1-heptanol) in the ink composition including the EML material of Example 3 was replaced with 2-methylbenzofuran.

Comparative Example 6

In Comparative Example 6, an ink composition of Comparative Example 6 was prepared in the same manner as in Example 3 except that the ink composition including the EML material was changed with respect to Example 3, and an organic EL element was formed.

In Comparative Example 6, the ink composition was prepared by dissolving the red light-emitting material (2 mass %) in hexylbenzene (normal boiling point: about 226° C.). Here, the solution including the EML material of Comparative Example 6 is at a level where the total amount of the first component (1,5-pentanediol) and the third component (1-heptanol) in the ink composition including the EML material of Example 3 was replaced with hexylbenzene.

Evaluation and Evaluation Results

Figures 17, 18:
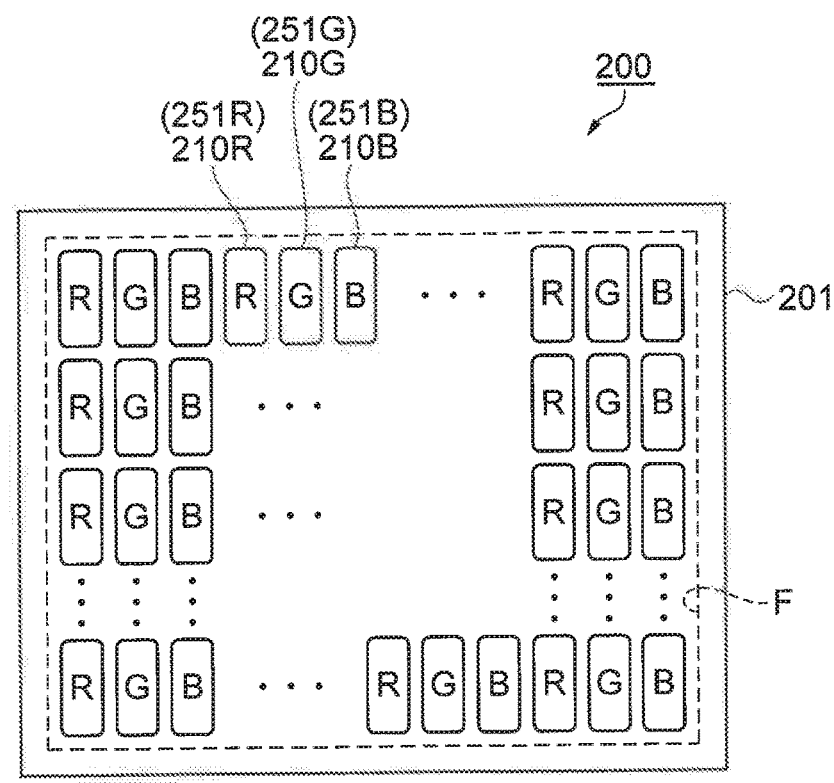
FIG. 17 is a chart showing the evaluation results of Example and Comparative Examples.
FIG. 18 is a schematic plan view showing a configuration of a color filter according to a third embodiment.

With respect to the light-emitting layers of Example 3 and Comparative Example 5, the evaluation of the uniformity of the film thickness was performed in the same manner as in Example 1. The evaluation results are shown in FIG. 17. Further, with respect to the properties of the organic EL elements of Example 3 and Comparative Example 6, the evaluation of the driving voltage, current efficiency, and half lifetime was performed in the same manner as in Example 1. In the same manner as in Example 1, the value of Comparative Example 2 was taken as 1.0, and the relative values with respect to this value are shown in FIG. 17.

The uniformity of the film thickness of the light-emitting layer and the properties of the organic EL element in this embodiment will be described with reference to FIG. 17. FIG. 17 is a chart showing the evaluation results of Example and Comparative Examples.

As shown in FIG. 17, with respect to the uniformity of the film thickness in the light-emitting layer, Example 3 is superior to Comparative Example 5. As described above, the ink composition including the EML material of Example 3 is different from that of Comparative Example 5 in that the hydrophilic solvent (first component) and the amphiphilic solvent (third component) are included. That is, the reason why Example 3 is superior is presumed to be because the phase including the EML material was covered, and the evaporation of the hydrophobic solvent (second component) proceeded slowly. Further, when the ink composition including the EML material of Example 3 changed into two phases, the main component of the upper layer was the hydrophilic solvent (first component), and the lower layer was composed of the hydrophobic solvent (second component). This phase configuration is opposite to that of Example 1, however, it was shown that also in this case, the uniformity of the film thickness is improved.

As shown in FIG. 17, with respect to the properties of the organic EL element, Example 3 is superior to Comparative Example 6. In Example 3, as compared with Comparative Example 6, the driving voltage is lower, the current efficiency is higher, and the half lifetime is longer, and therefore, it was shown that with respect to all properties, Example 3 is superior to Comparative Example 6. This is considered to be because as the hydrophobic solvent (second component) which dissolves the EML material, hexylbenzene (normal boiling point: about 226° C.) is used in Comparative Example 6, however, in Example 3, 2-methylbenzofuran (normal boiling point: about 197° C.) having a low normal boiling point is used. That is, it is presumed that by using 2-methylbenzofuran, the amount of the hydrophobic solvent (second component) remaining in the light-emitting layer was reduced, and the above-mentioned properties were improved. Incidentally, the organic EL element of Comparative Example 5 had poor uniformity of the film thickness of the light-emitting layer and could not be subjected to evaluation of the properties, and therefore, the evaluation was omitted.

Third Embodiment

Color Filter and Method for Producing Color Filter

An optical element according to this embodiment will be described by showing a color filter as an example. Through a color filter, red (R), green (G), and blue (B) transmitted light is obtained, and therefore, the color filter is used in a liquid crystal display device, an organic EL device including an organic EL element which emits white light, or the like.

FIG. 18 is a schematic plan view showing a configuration of a color filter according to the third embodiment.

A color filter 200 shown in FIG. 18 includes a transparent substrate 201 on which pixel portions 210R, 210G, and 210B from which red (R), green (G), and blue (B) transmitted light (transmitted color) is obtained are arranged. Each of the pixel portions 210R, 210G, and 210B has a substantially rectangular shape, and is arranged in a matrix form in a display region F of the transparent substrate 201.

In the pixel portion 210R, a colored layer 251R through which red (R) transmitted light is obtained is provided. Similarly, in the pixel portion 210G, a colored layer 251G through which green (G) transmitted light is obtained is provided, and in the pixel portion 210B, a colored layer 251B through which blue (B) transmitted light is obtained is provided.

In the color filter 200, one display pixel unit is constituted by the pixel portions 210R, 210G, and 210B from which transmitted light of a different color is obtained. Such a color filter 200 is mounted on a liquid crystal display device, an organic EL device, or the like, and by electrically controlling the transmitted light for the respective pixel portions 210R, 210G, and 210B, full color display can be achieved.

Figure 19A:
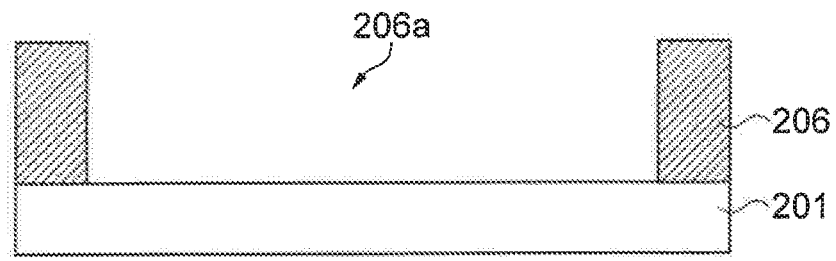
FIG. 19A is a schematic cross-sectional view showing a method for producing a color filter.
Figure 19B:
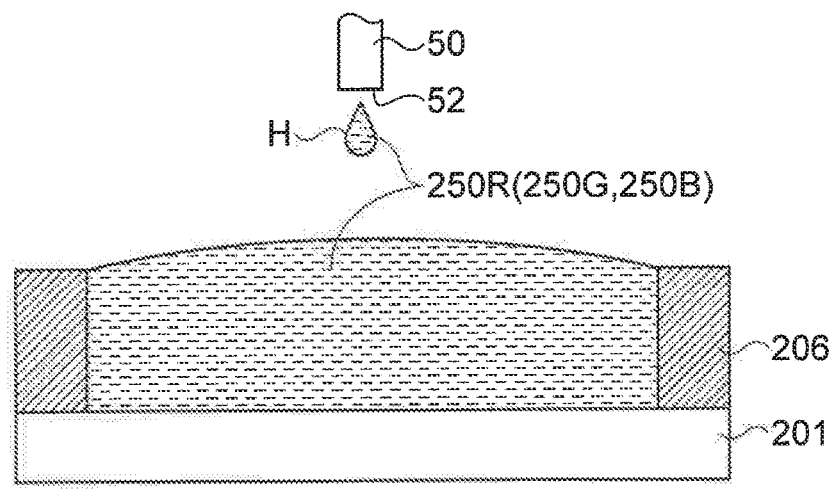
FIG. 19B is a schematic cross-sectional view showing a method for producing a color filter.
Figure 19C:
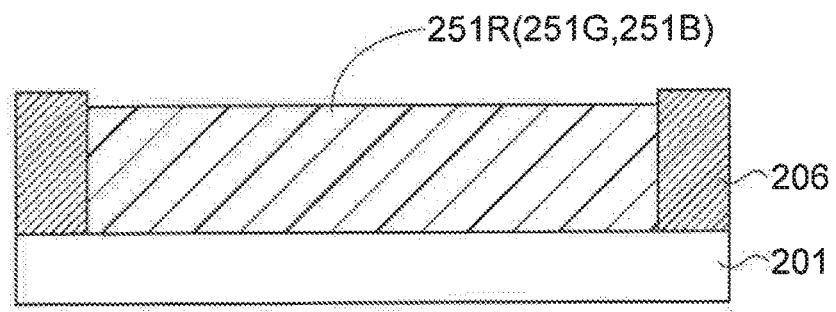
FIG. 19C is a schematic cross-sectional view showing a method for producing a color filter.

Next, a method for producing the color filter 200 will be described with reference to FIGS. 19A, 19B, and 19C. FIGS. 19A, 19B, and 19C are schematic cross-sectional views showing a method for producing a color filter.

The method for producing a color filter of this embodiment includes a step of forming a color filter using ink compositions 250R, 250G, and 250B, each of which includes a first component which is a hydrophilic solvent, a second component which is a hydrophobic solvent, a third component which is an amphiphilic solvent, and a fourth component which includes a solute or a dispersing element, and changes from one phase to two phases when the third component evaporates. Further, the fourth component includes a coloring material and a resin component as the solute or the dispersing element.

First, as shown in FIG. 19A, on one surface of the transparent substrate 201, a black matrix 206 is formed. In the formation of the black matrix 206, a resin with no light transmission property (for example, a photosensitive resin including a pigment having a light blocking property) is applied to a predetermined thickness (for example, about 2 μm) by a method such as spin coating, followed by patterning using a photolithography process. By doing this, an opening portion 206a defined by the black matrix 206 is formed.

Subsequently, as shown in FIG. 19B, the ink compositions 250R, 250G, and 250B are applied individually to the corresponding opening portions 206a. As the method for applying the ink compositions 250R, 250G, and 250B, an inkjet method in which each ink composition is ejected as an ink droplet (liquid droplet H) from a nozzle 52 of an inkjet head 50 is used. The ejection amount of the liquid droplet H ejected from the inkjet head 50 can be controlled in picoliter (pl) order, and the liquid droplets H whose number is calculated by dividing a predetermined amount by the ejection amount of the liquid droplet H is ejected to the opening portion 206*a*.

Each of the ink compositions 250R, 250G, and 250B includes a first component which is a hydrophilic solvent, a second component which is a hydrophobic solvent, a third component which is an amphiphilic solvent, and a solute or a dispersing element as a fourth component. The ink composition 250R includes a coloring material (for example, a dye) capable of obtaining red transmitted light as the solute or the dispersing element, and a resin component for fixing the coloring material to the opening portion 206*a* to form a layer. The ink composition 250G includes a coloring material capable of obtaining green transmitted light in place of the coloring material capable of obtaining red transmitted light, and the ink composition 250B includes a coloring material capable of obtaining blue transmitted light in place of the coloring material capable of obtaining red transmitted light.

As the hydrophilic solvent (first component), the hydrophobic solvent (second component), and the amphiphilic solvent (third component), those exemplified in the above first embodiment can be used. In this embodiment, as the coloring material, a water-soluble dye is used, and as the resin component, an aqueous resin emulsion is used. Therefore, the coloring material and the resin component have solubility or dispersibility in the first component (hydrophilic solvent). Due to this, the specific gravity of the first component is set larger than the specific gravity of the second component, the normal boiling point of the first component is set lower than the normal boiling point of the second component, and the normal boiling point of the third component is set lower than the normal boiling point of the first component and the normal boiling point of the second component. The relationship of the specific gravity and the normal boiling point between the first component and the second component is set opposite thereto, and a coloring material and a resin component having solubility or dispersibility in the hydrophobic solvent (second component) may be used as the fourth component.

After the ink compositions 250R, 250G, and 250B are applied to the opening portion 206*a*, the process proceeds to a drying step. In the drying step, the amphiphilic solvent (third component) contained in the ink compositions 250R, 250G, and 250B is evaporated, and a change into two phases is exhibited. Due to the relationship of the specific gravity and the normal boiling point between the hydrophilic solvent (first component) and the hydrophobic solvent (second component) described above, the evaporation of the hydrophilic solvent (first component) in which the coloring material and the resin component are mainly included proceeds slowly. As a result, as shown in FIG. 19C, the colored layers 251R, 251G, and 251B, each of which has a uniform film thickness and is flat, are formed.

Subsequently, the surface of the transparent substrate 210 is flattened, and an overcoat film (not shown) for protecting the colored layers 251R, 251G, and 251B is formed, whereby the color filter 200 is formed.

As described above, with the use of the method for producing the color filter 200 as the optical element according to this embodiment, the following effects can be obtained.

In each of the ink compositions 250R, 250G, and 250B including the color filter forming material, the uniformity of the ink components during storage or the like is ensured, and also in each of the colored layers 251R, 251G, and 251B to be formed, the uniformity of the film thickness can be improved. Further, the drying property of each of the ink compositions 250R, 250G, and 250B is controlled by a phase change so as to improve the flatness of each of the colored layers 251R, 251G, and 251B, and thus, the uniformity of the film thickness can be further improved. In addition, the residual solvent in each of the formed colored layers 251R, 251G, and 251B is reduced, whereby deterioration over time can be suppressed. As a result, a method for producing the color filter 200 in which a variation in the intensity of transmitted light is reduced as compared with the related art, and the quality is stable over a long period of time can be provided.

The invention is not limited to the above-mentioned embodiments, and various changes, improvements, etc. can be added to the embodiments. Hereinafter, a modification example will be described.

Modification Example 1

In the above-mentioned embodiments, the ink composition for forming an organic semiconductor element or an optical element and the method for producing the same, etc. are described by showing an organic EL element and a color filter as examples, however, the ink composition according to the invention can also be applied to the formation of other functional layers. As other functional layers, for example, elements such as an organic field effect transistor and an organic solar cell are exemplified. Further, the ink composition can also be applied to the field of printed electronics to be used for the production of wirings, circuits, sensors, etc. By applying the ink composition or the production method according to the invention thereto, separation of ink components is suppressed, the uniformity of the film thickness is improved in a functional layer or the like to be formed, and the residual solvent can be reduced.

The entire disclosure of Japanese Patent Application No. 2016-146022, filed Jul. 26, 2016 is expressly incorporated by reference herein.

What is claimed is:

1. An ink composition, comprising:
  a first component which is a hydrophilic solvent;
  a second component which is a hydrophobic solvent;
  a third component which is an amphiphilic solvent; and
  a fourth component which includes a solute or a dispersing element, wherein
    when the third component evaporates, the ink composition changes from one phase to two phases,
    the specific gravity of the first component is smaller than the specific gravity of the second component, and
    the normal boiling point of the first component is higher than the normal boiling point of the second component.

2. The ink composition according to claim 1, wherein the normal boiling point of the third component is lower than the normal boiling point of the first component and the normal boiling point of the second component.

3. The ink composition according to claim 1, wherein the solubility of the third component in the first component or the second component is 0.1 mass % or more.

4. The ink composition according to claim 1, wherein
  the first component includes at least one type selected from a glycol ether compound or an alkanediol compound, the second component includes at least one type selected from an aromatic hydrocarbon compound and a heterocyclic compound, and the third component includes at least one type selected from a monoalcohol compound having 4 or more carbon atoms and an alkanone compound having 4 or more carbon atoms.

5. The ink composition according to claim 4, wherein the first component is selected from diethylene glycol, dipropylene glycol, triethylene glycol, tetraethylene glycol, triethylene glycol monobutyl ether, diethylene glycol monomethyl ether, triethylene glycol monomethyl ether, diethylene glycol monoisopropyl ether, ethylene glycol monobutyl ether, diethylene glycol monobutyl ether, ethylene glycol monoisobutyl ether, diethylene glycol monoisobutyl ether, ethylene glycol monohexyl ether, diethylene glycol monohexyl ether, ethylene glycol mono-2-ethylhexyl ether, diethylene glycol mono-2-ethylhexyl ether, ethylene glycol monoallyl ether, dipropylene glycol monomethyl ether, dipropylene glycol monopropyl ether, propylene glycol monobutyl ether, dipropylene glycol monobutyl ether, 1,2-ethanediol, 1,2-propanediol, 1,3-butanediol, 1,4-butanediol, 2,3-butanediol, 1,5-pentanediol, 2-methyl-2,4-pentanediol, 1,6-hexanediol, and 2-ethyl-1,3-hexanediol, the second component is selected from hexylbenzene, heptylbenzene, octylbenzene, nonylbenzene, decylbenzene, undecylbenzene, dodecylbenzene, diisopropylbenzene, cyclohexylbenzene, diphenyl ether, 3-phenoxytoluene, bisdimethylphenylethane, 2,3-dihydrobenzofuran, 2,3-dihydro-2-methylbenzofuran, 2,3-dihydro-2-ethylbenzofuran, and 2-methylbenzofuran, and the third component is selected from 1-butanol, 1-pentanol, 1-hexanol, 1-heptanol, 1-octanol, 1-nonanol, 2-butanone, 2-hexanone, 2-heptanone, 2-octanone, 2-nonanone, 2-decanone, 2-undecanone, and 2-dodecanone.

6. The ink composition according to claim 5, wherein the content of the second component with respect to the total mass is 10 mass % or more and 90 mass % or less, the content of the third component with respect to the total mass is 0.1 mass % or more and 50 mass % or less, and the content of the fourth component with respect to the total mass is 5 mass % or less.

* * * * *